(12) United States Patent
Feng

(10) Patent No.: US 8,466,060 B2
(45) Date of Patent: Jun. 18, 2013

(54) STACKABLE POWER MOSFET, POWER MOSFET STACK, AND PROCESS OF MANUFACTURE

(75) Inventor: Tao Feng, Santa Clara, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 387 days.

(21) Appl. No.: 12/772,048

(22) Filed: Apr. 30, 2010

(65) Prior Publication Data

US 2011/0266683 A1 Nov. 3, 2011

(51) Int. Cl.
*H01L 21/44* (2006.01)
*H01L 23/48* (2006.01)

(52) U.S. Cl.
USPC .......... 438/667; 257/698; 257/E21.499; 257/E23.174

(58) Field of Classification Search
USPC .......... 438/667; 257/E21.499, E23.174, 257/698
See application file for complete search history.

(56) References Cited

U.S. PATENT DOCUMENTS

| 2002/0190285 | A1* | 12/2002 | Sakamoto et al. | 257/288 |
| 2006/0220178 | A1* | 10/2006 | Kubo et al. | 257/532 |
| 2007/0052067 | A1* | 3/2007 | Umemoto | 257/587 |
| 2009/0224313 | A1* | 9/2009 | Burke | 257/330 |
| 2010/0171217 | A1* | 7/2010 | Akram et al. | 257/738 |

* cited by examiner

*Primary Examiner* — Caridad Everhart
(74) *Attorney, Agent, or Firm* — Chen-Hwa Tsao; CH Emily LLC

(57) ABSTRACT

A thin and stackable power MOSFET (SP-MOSFET) and method are proposed. The SVP-MOSFET includes semiconductor substrate with bottom drain metal layer. Formed atop the semiconductor substrate are trenched gate regions and source-body regions. A patterned gate metal layer and source-body metal layer respectively contact trenched gate regions and source-body regions. At least one of through substrate drain via (TSDV), through substrate gate via (TSGV), through substrate source via (TSSV) is provided. The TSDV, formed through semiconductor substrate and in contact with drain metal layer, has top drain contacting pad and bottom drain contacting pad for making top and bottom contacts thereto. Similarly the TSGV, formed through semiconductor substrate and in contact with gate metal layer, has top gate contacting pad and bottom gate contacting pad. Likewise the TSSV, formed through semiconductor substrate and in contact with source-body metal layer, has top source contacting pad and bottom source contacting pad.

24 Claims, 25 Drawing Sheets

Fig. 1 Present Invention

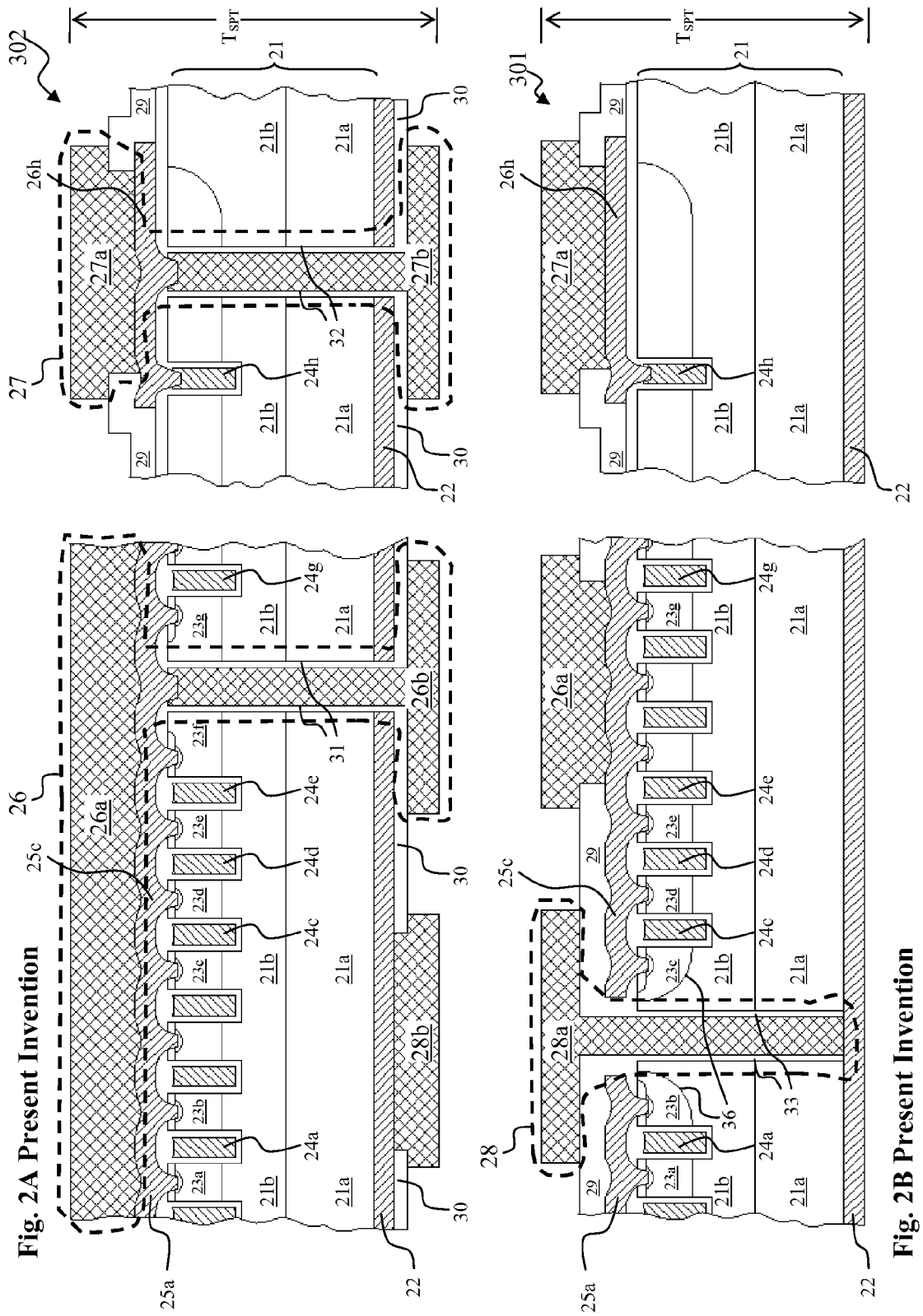
Fig. 2A Present Invention
Fig. 2B Present Invention

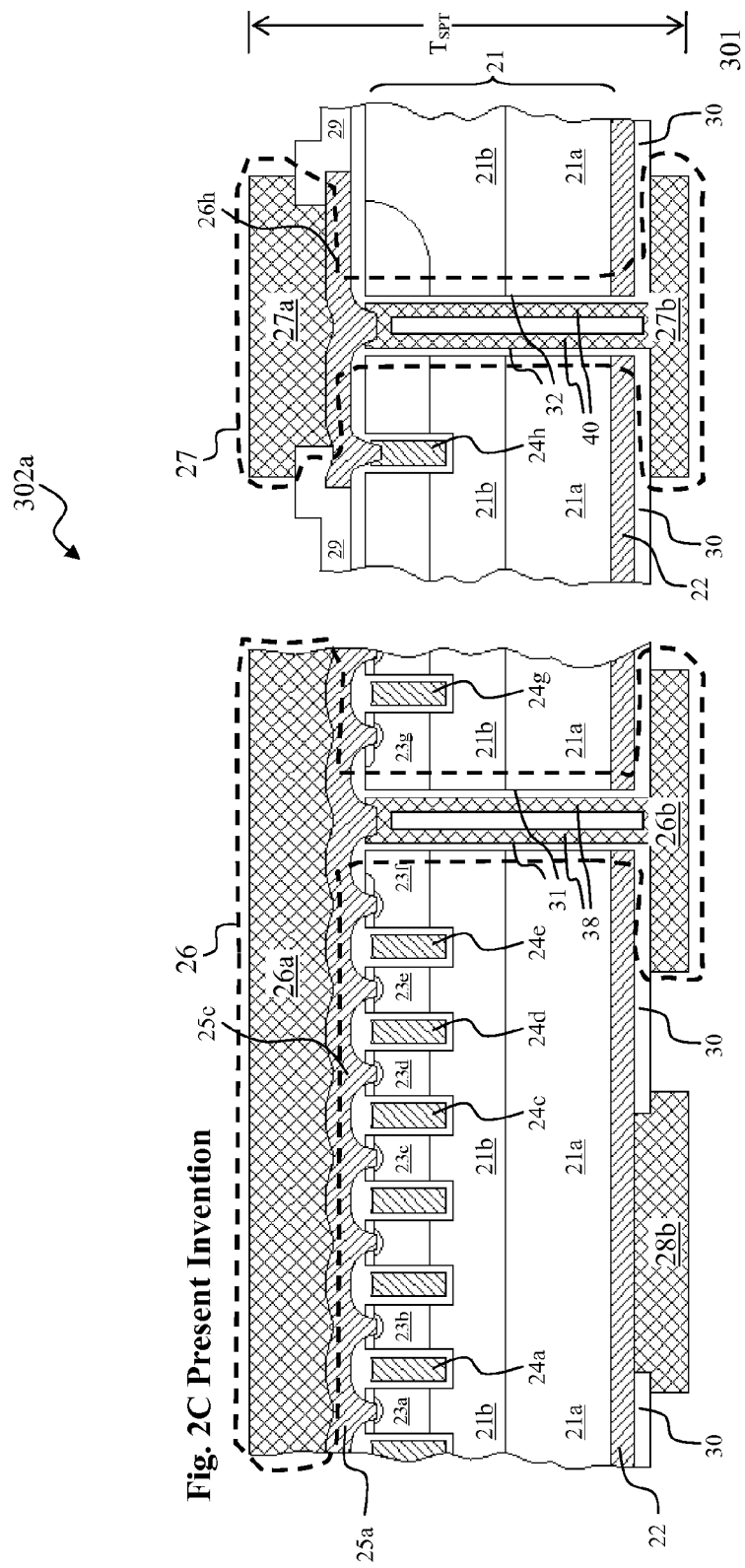
Fig. 2C Present Invention

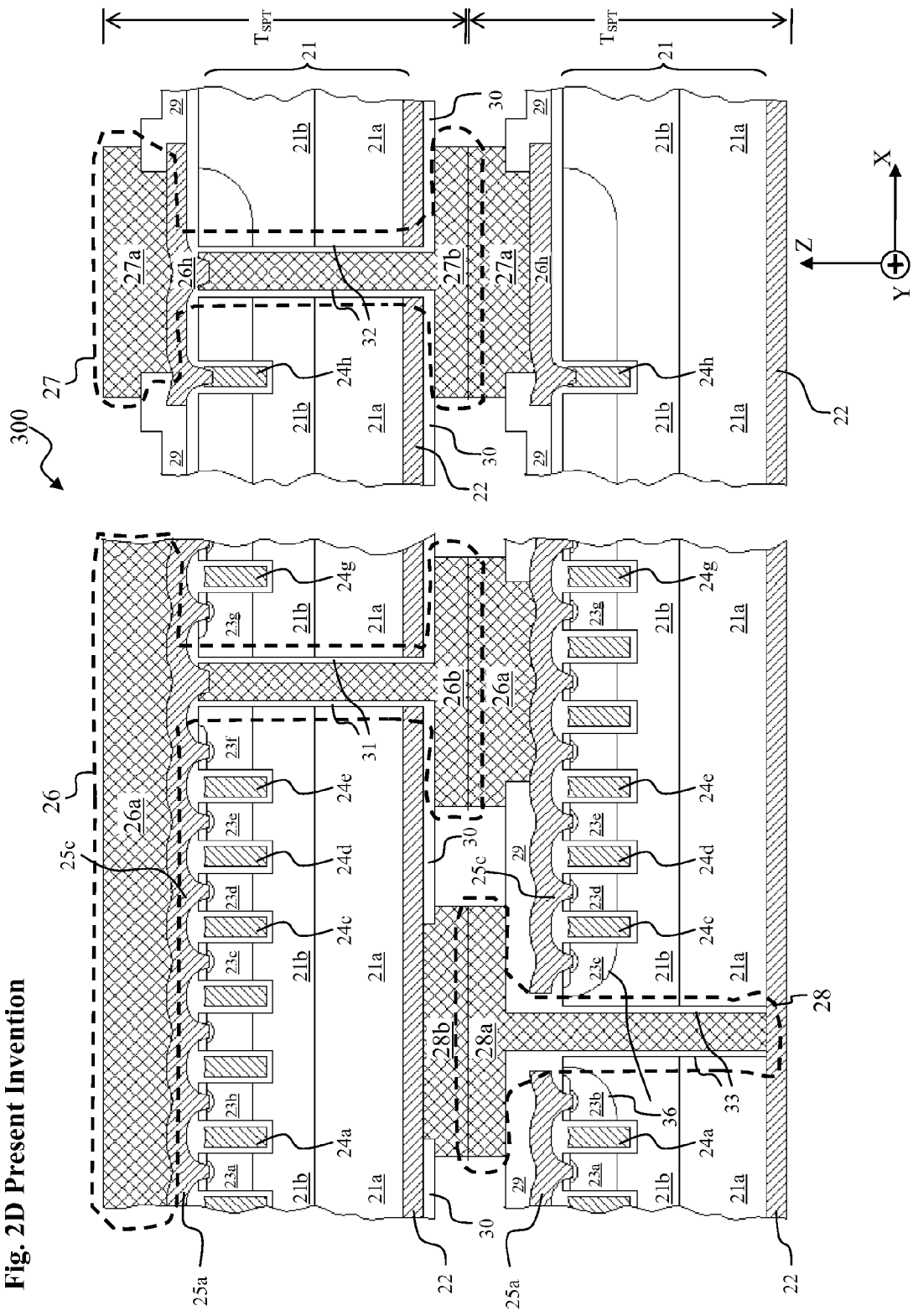
Fig. 2D Present Invention

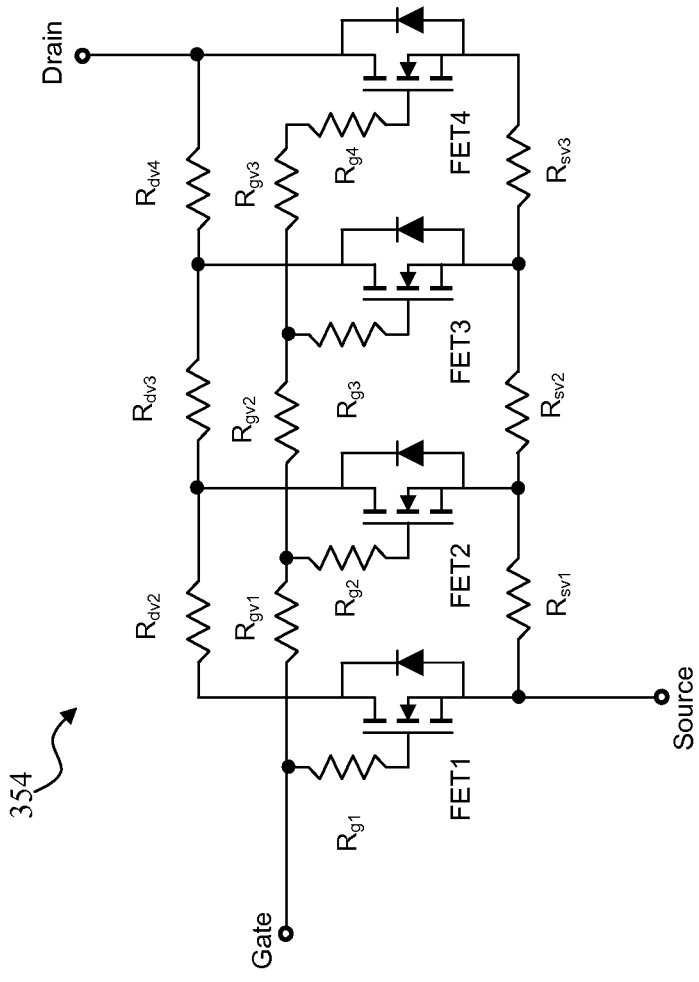
Fig. 3B Present Invention
Fig. 3A Present Invention

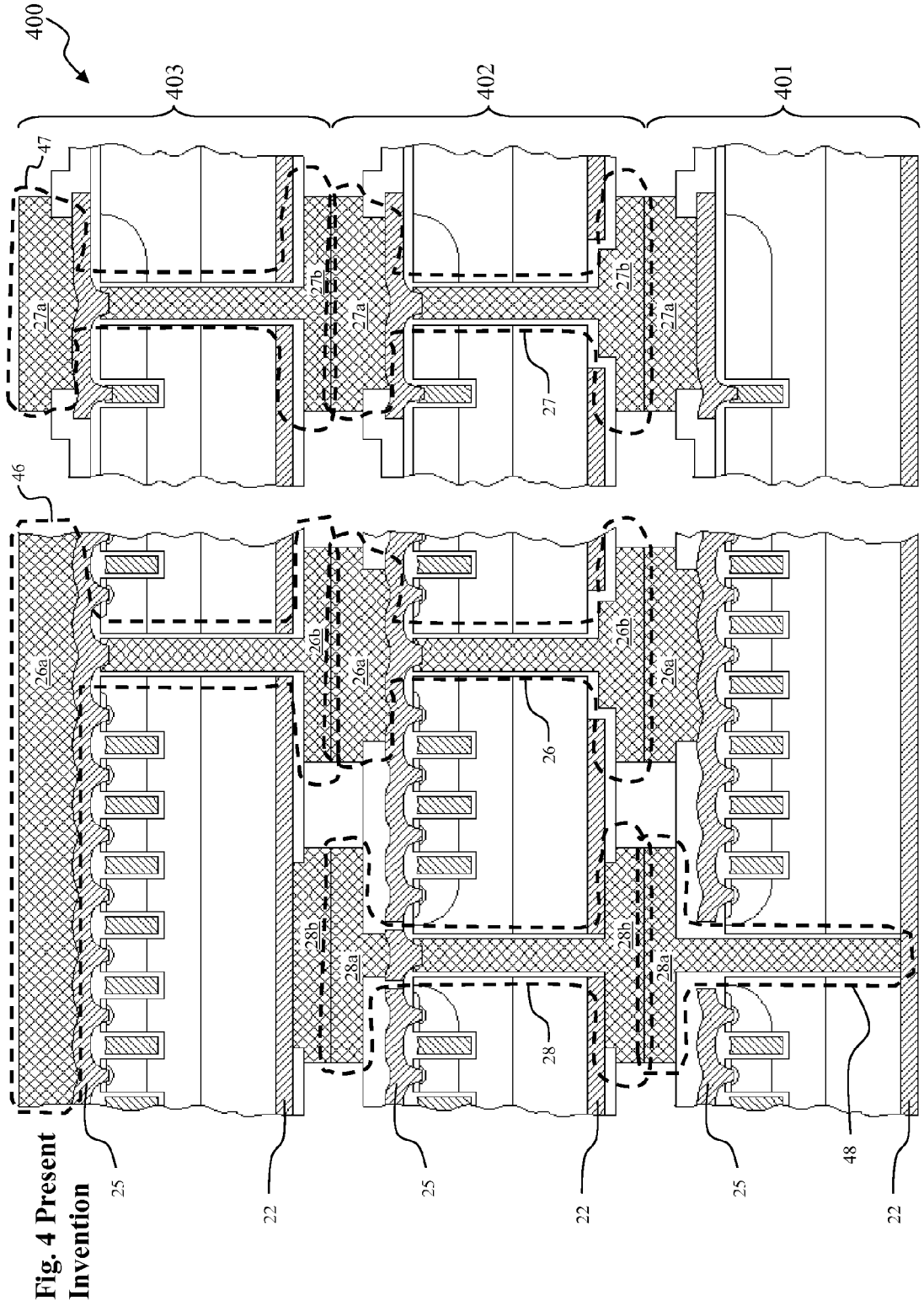
Fig. 4 Present Invention

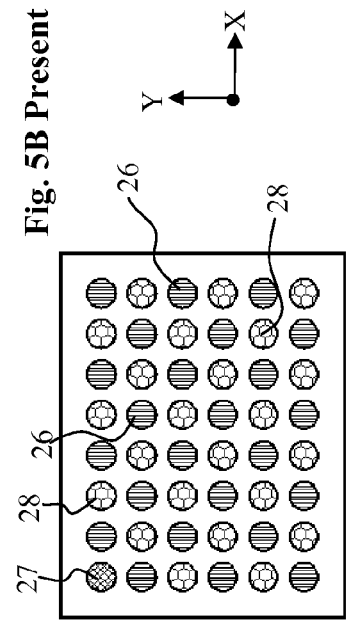
Fig. 5A Present Invention
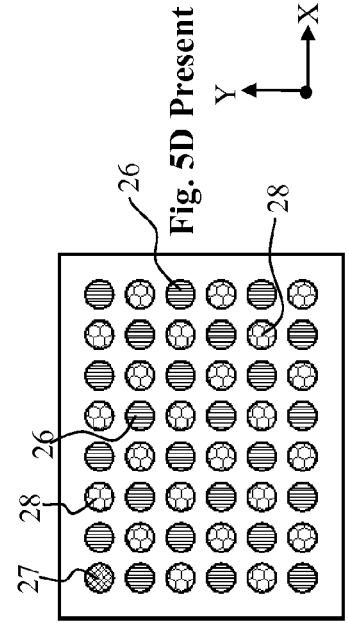
Fig. 5B Present Invention
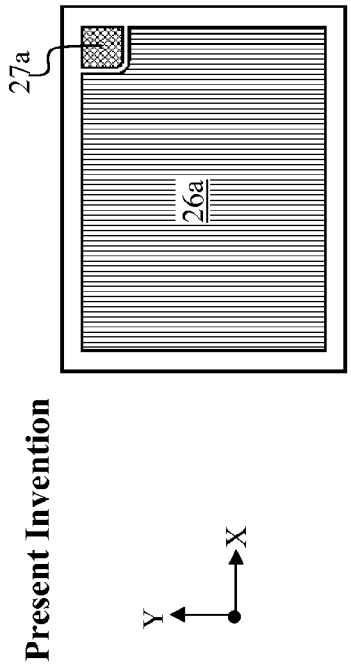
Fig. 5C Present Invention
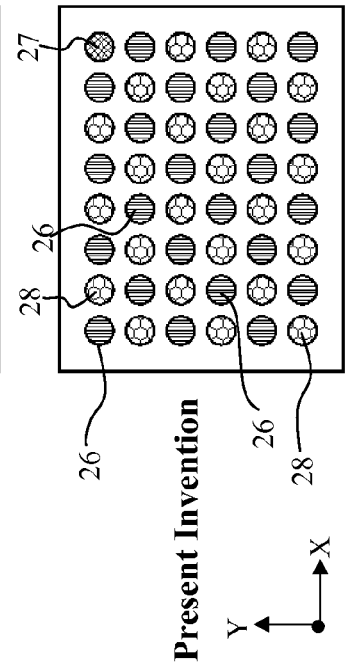
Fig. 5D Present Invention
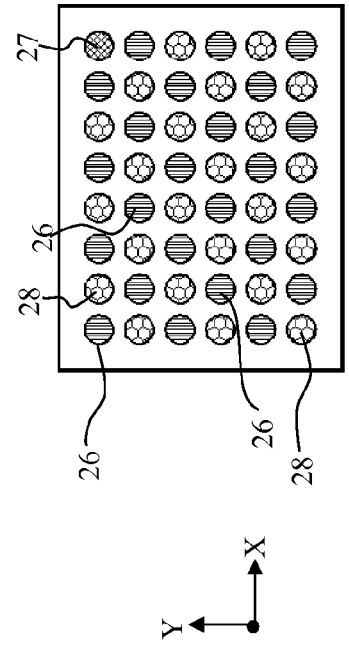
Fig. 5E Present Invention
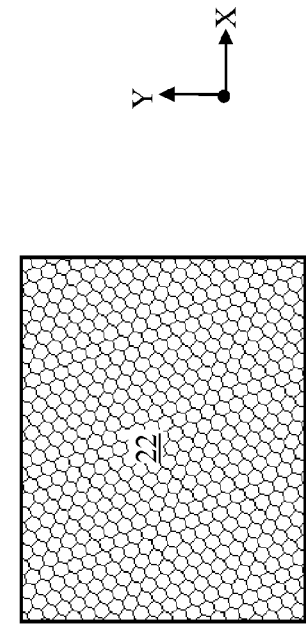
Fig. 5F Present Invention

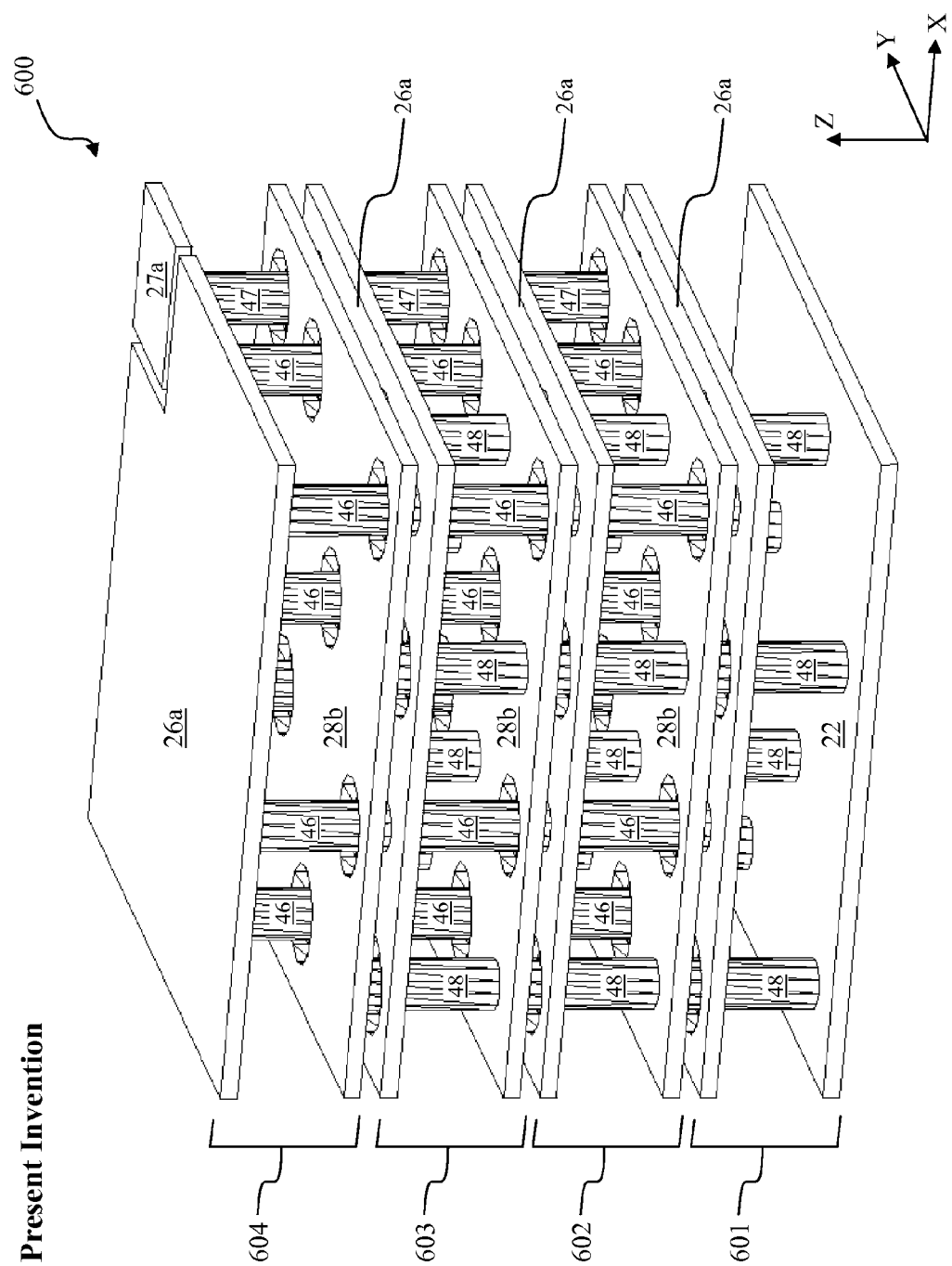
Fig. 6A Present Invention

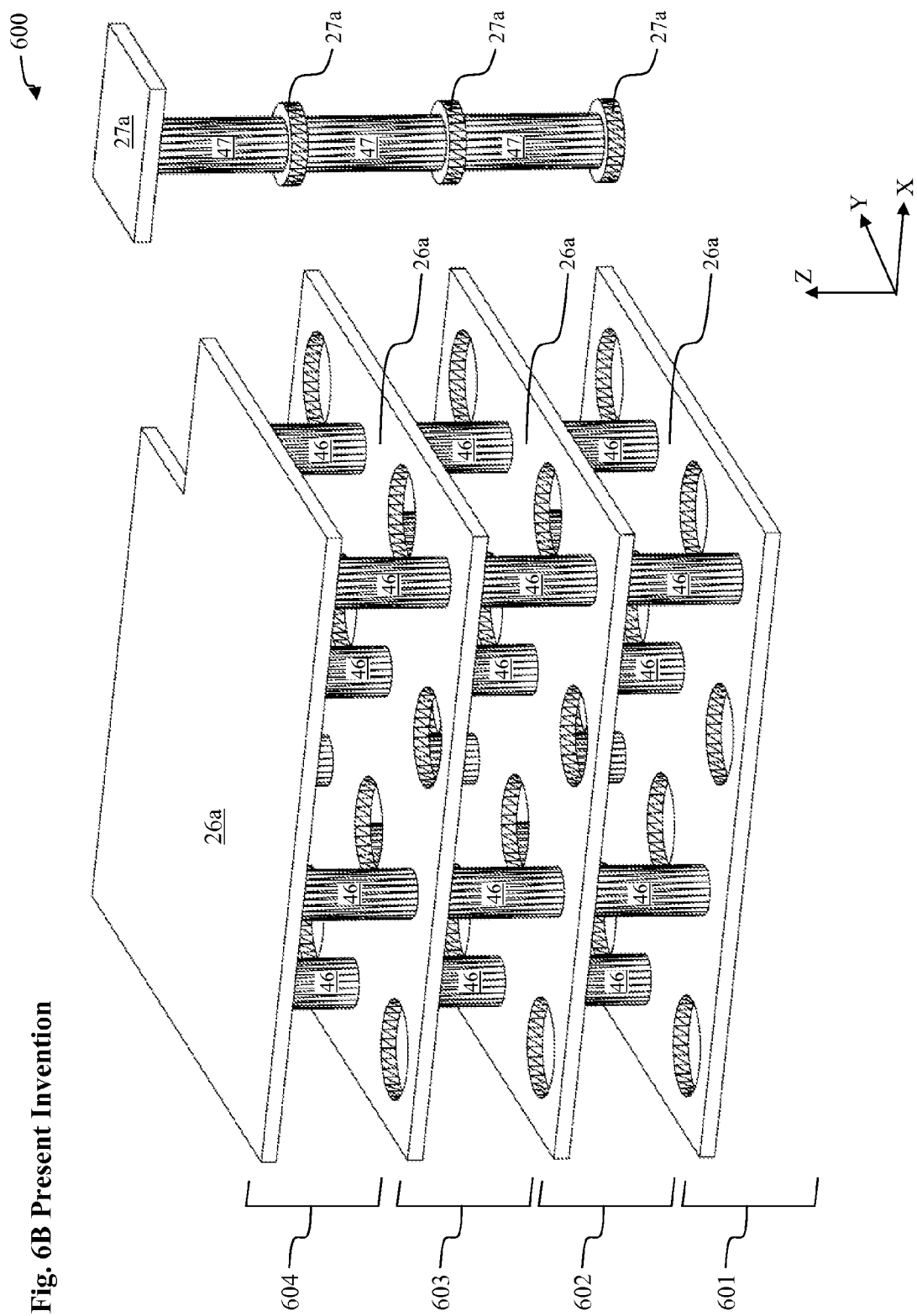
Fig. 6B Present Invention

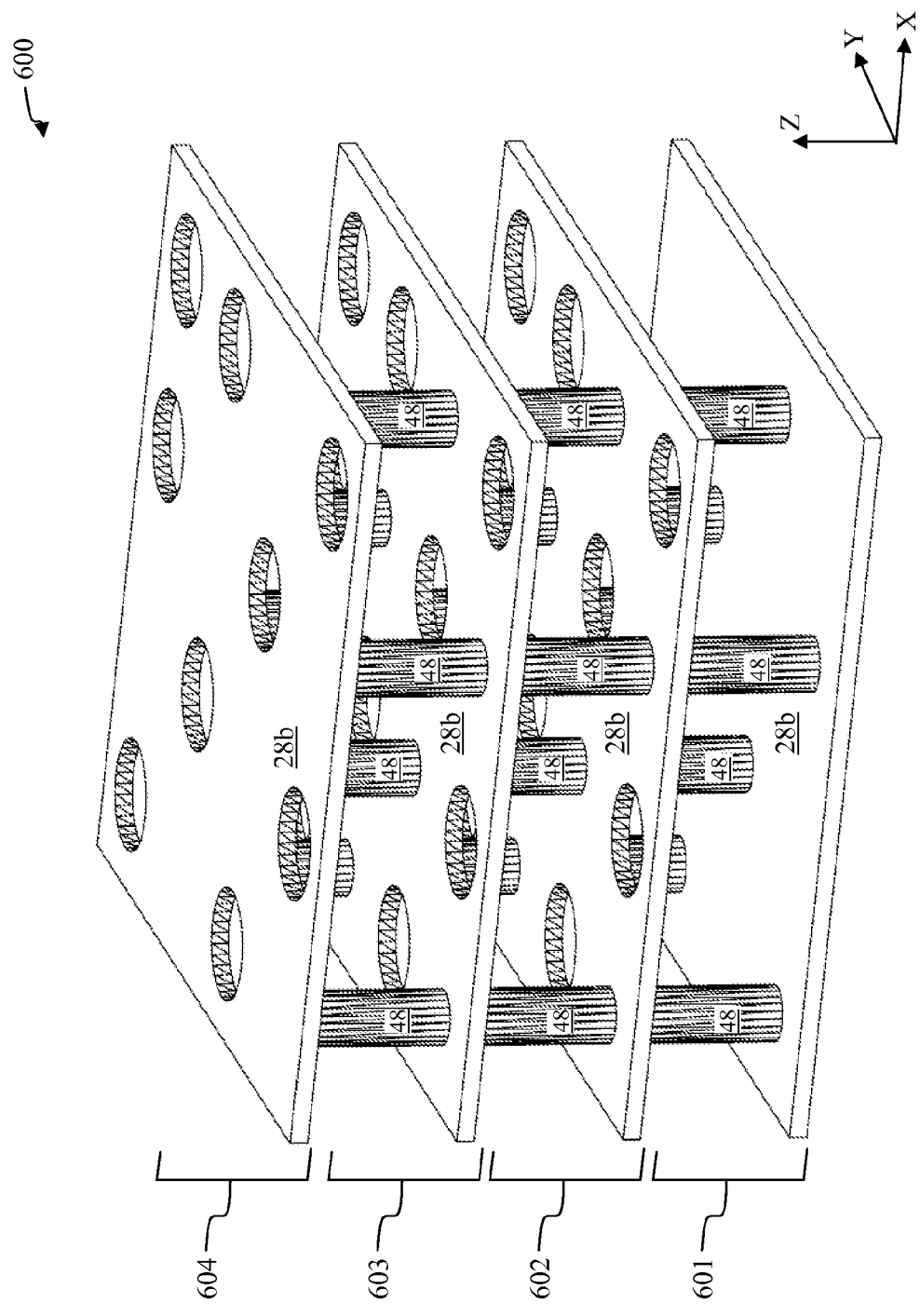
Fig. 6C Present Invention

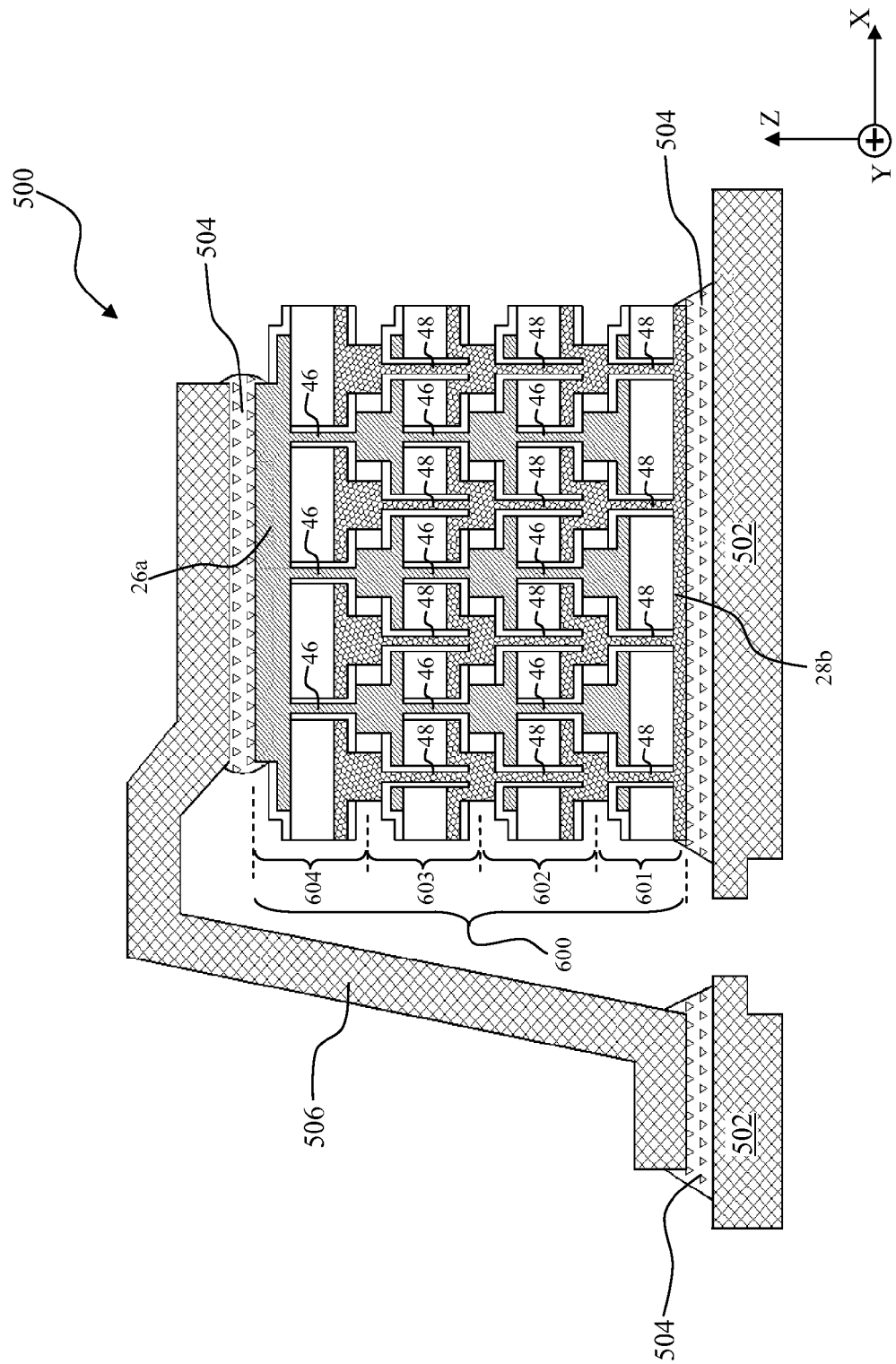
Fig. 6D Present Invention

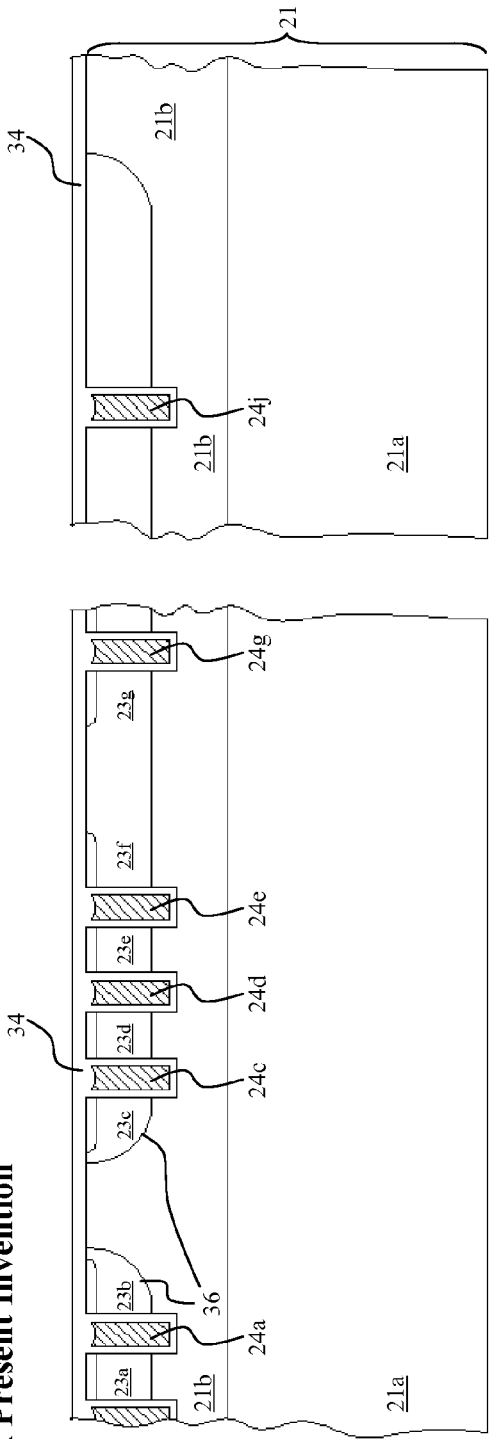
Fig. 7A Present Invention
Fig. 7B Present Invention

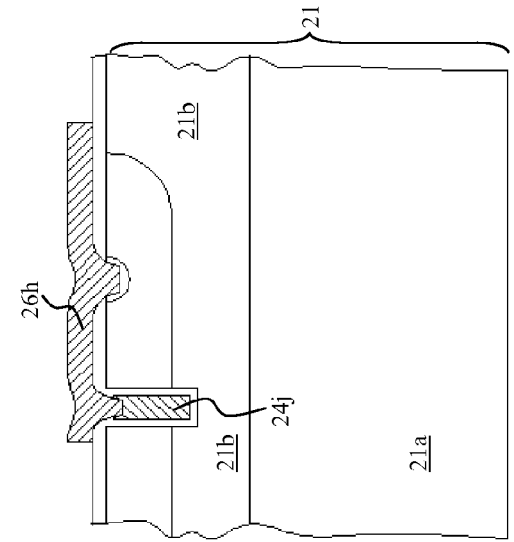
Fig. 7C Present Invention
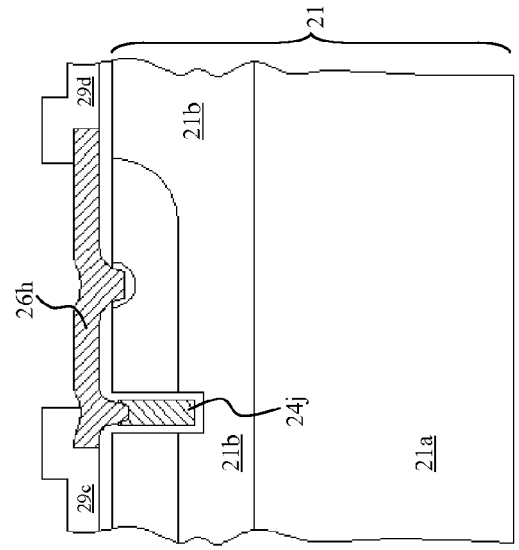
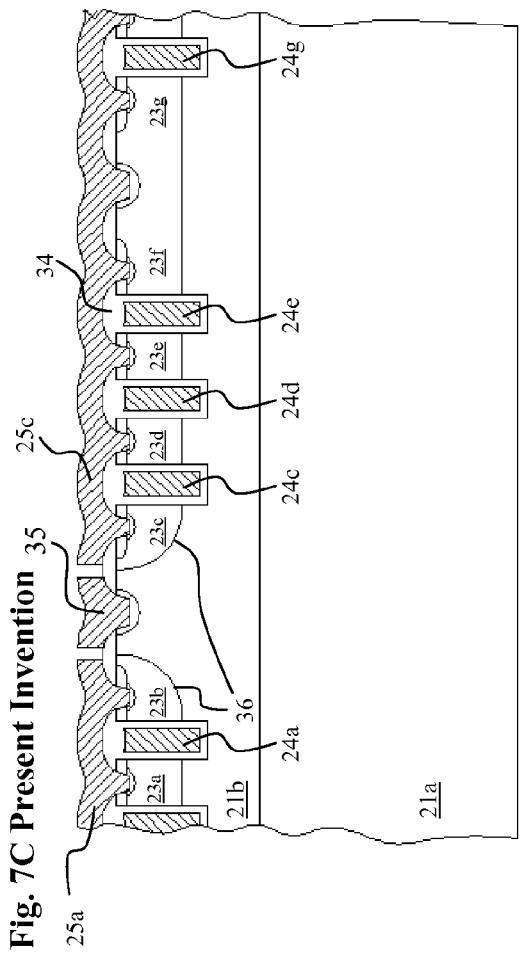
Fig. 7D Present Invention
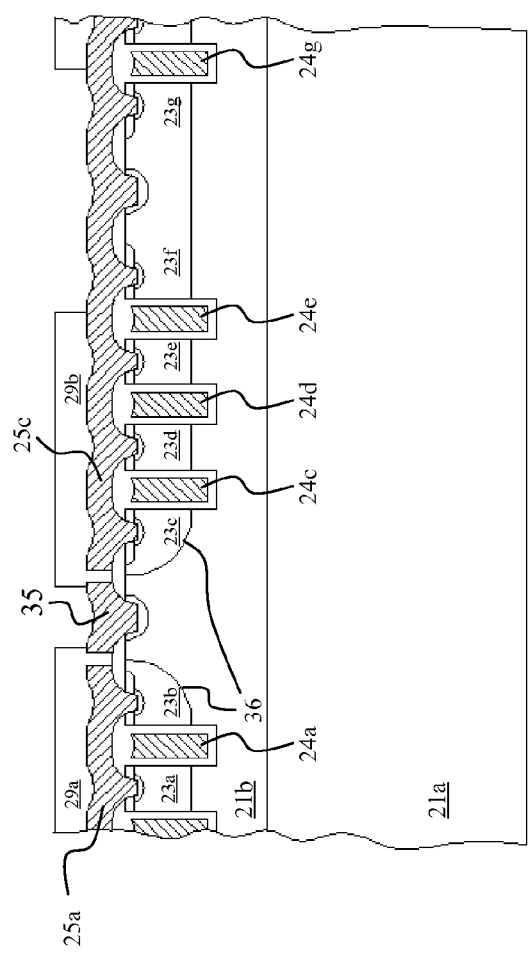

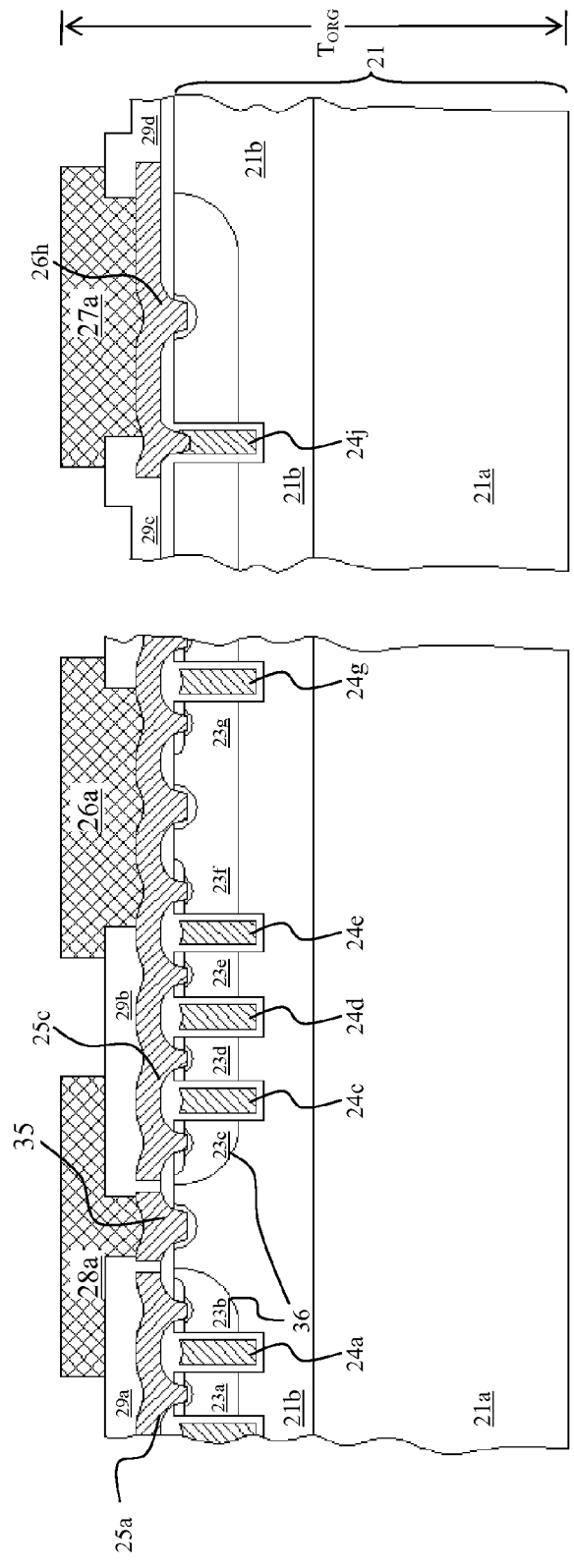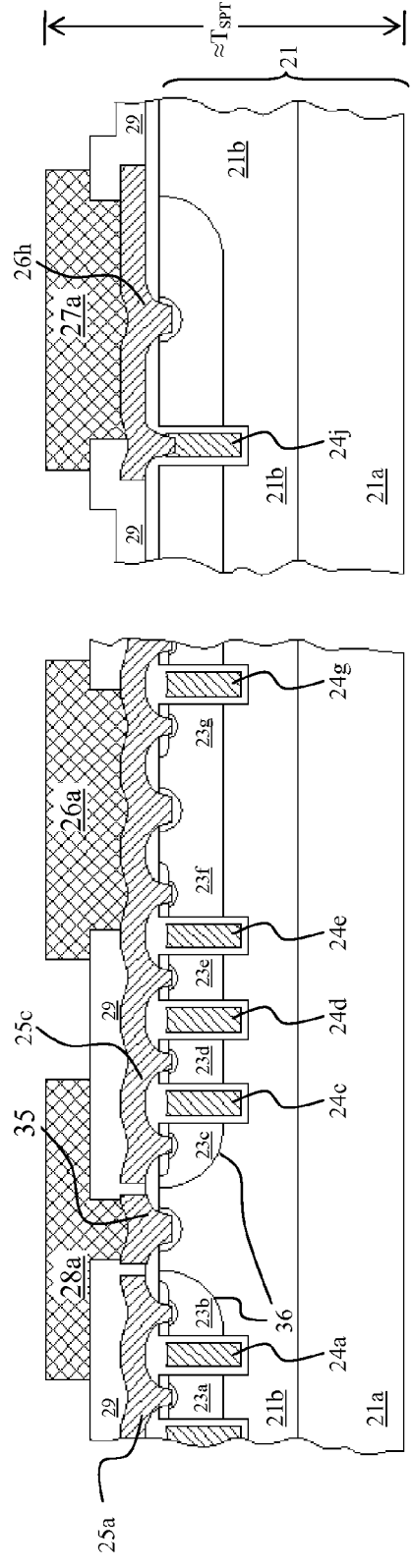
Fig. 7E Present Invention
Fig. 7F Present Invention

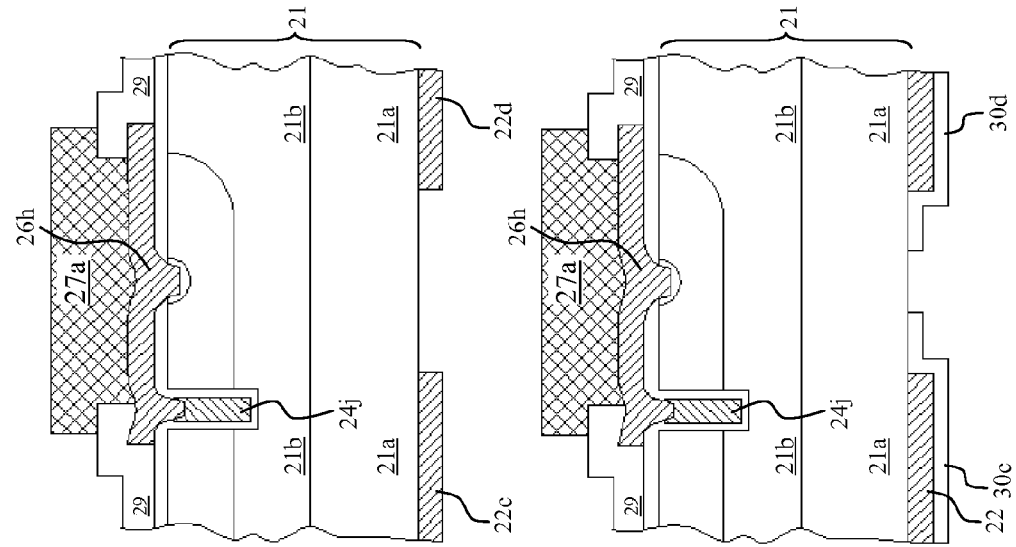
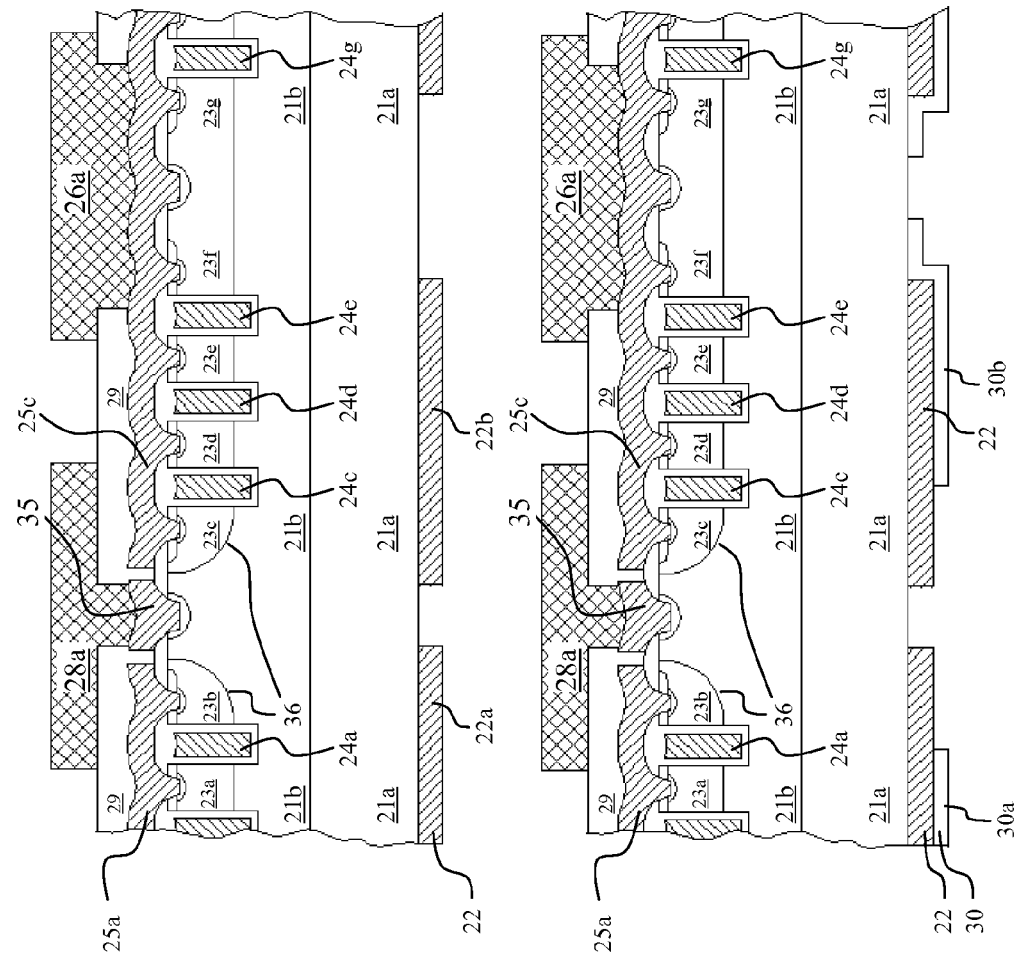
Fig. 7G Present Invention
Fig. 7H Present Invention

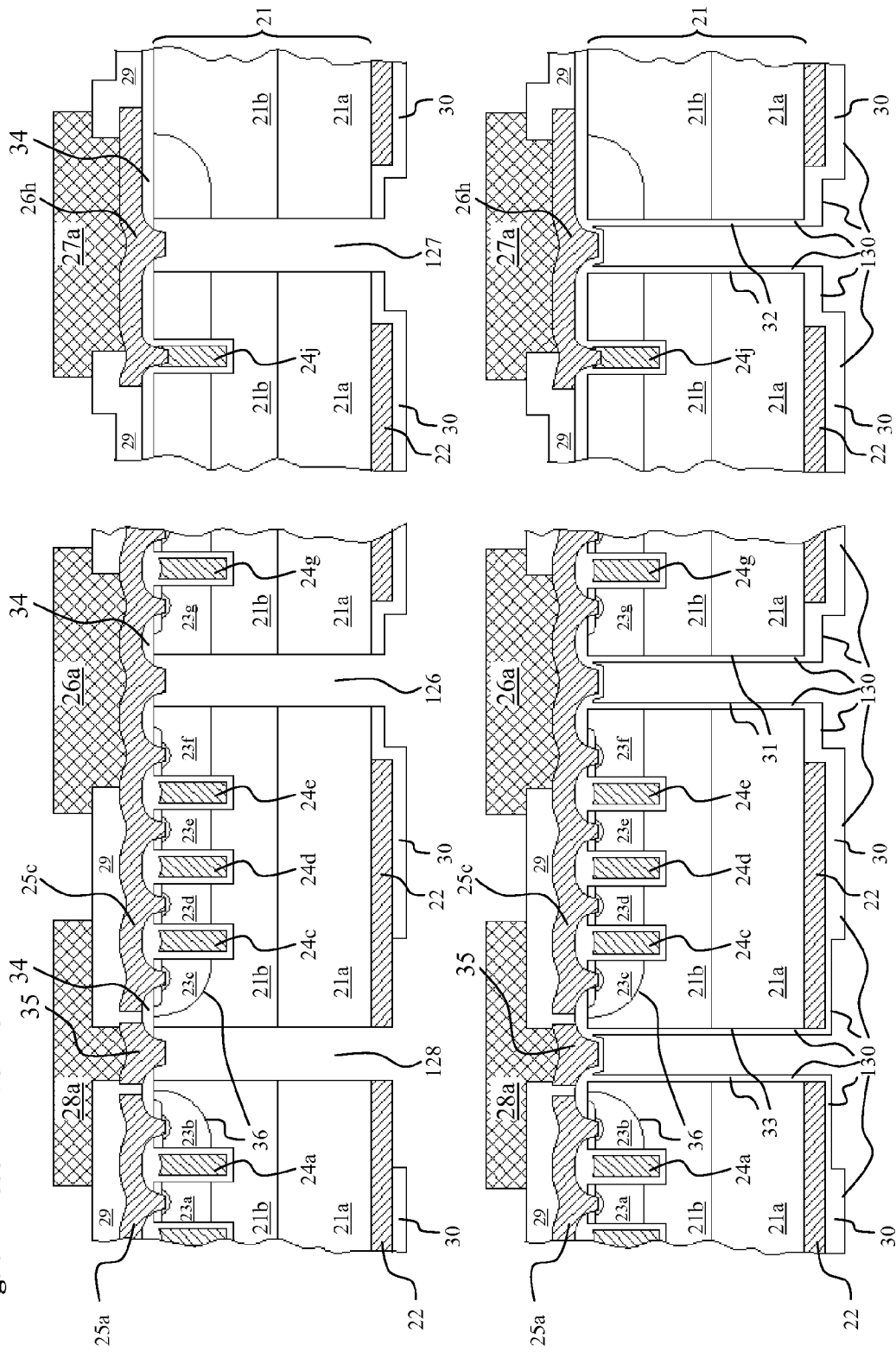
Fig. 7I Present Invention
Fig. 7J Present Invention

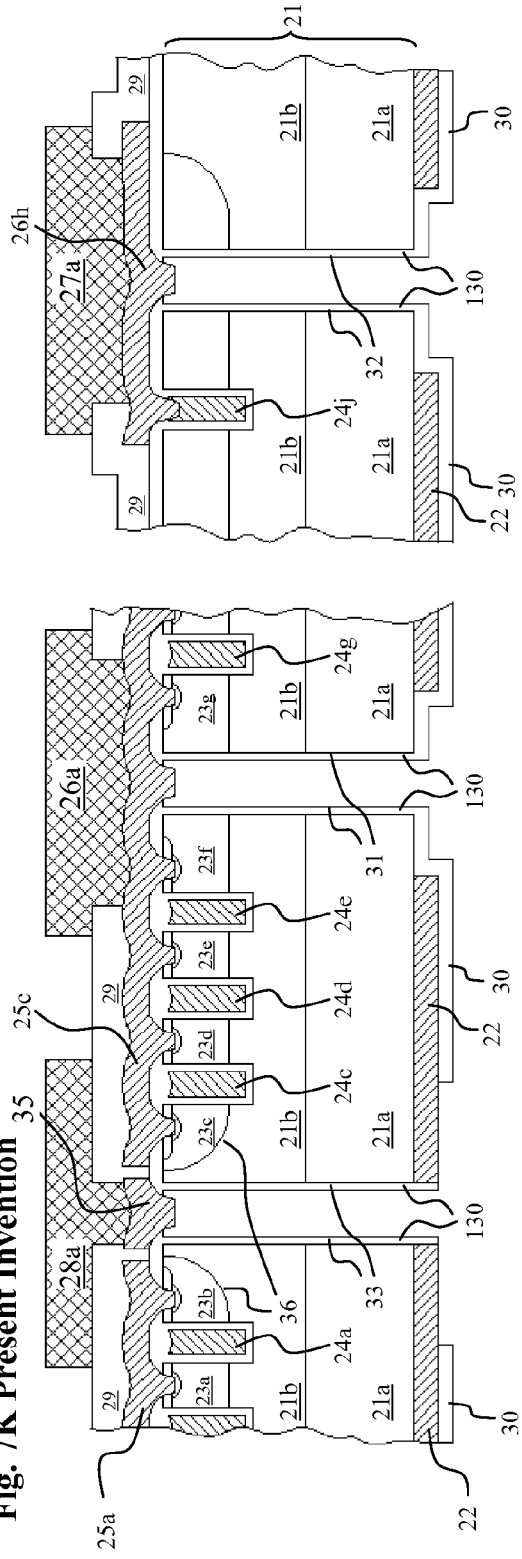
Fig. 7K Present Invention
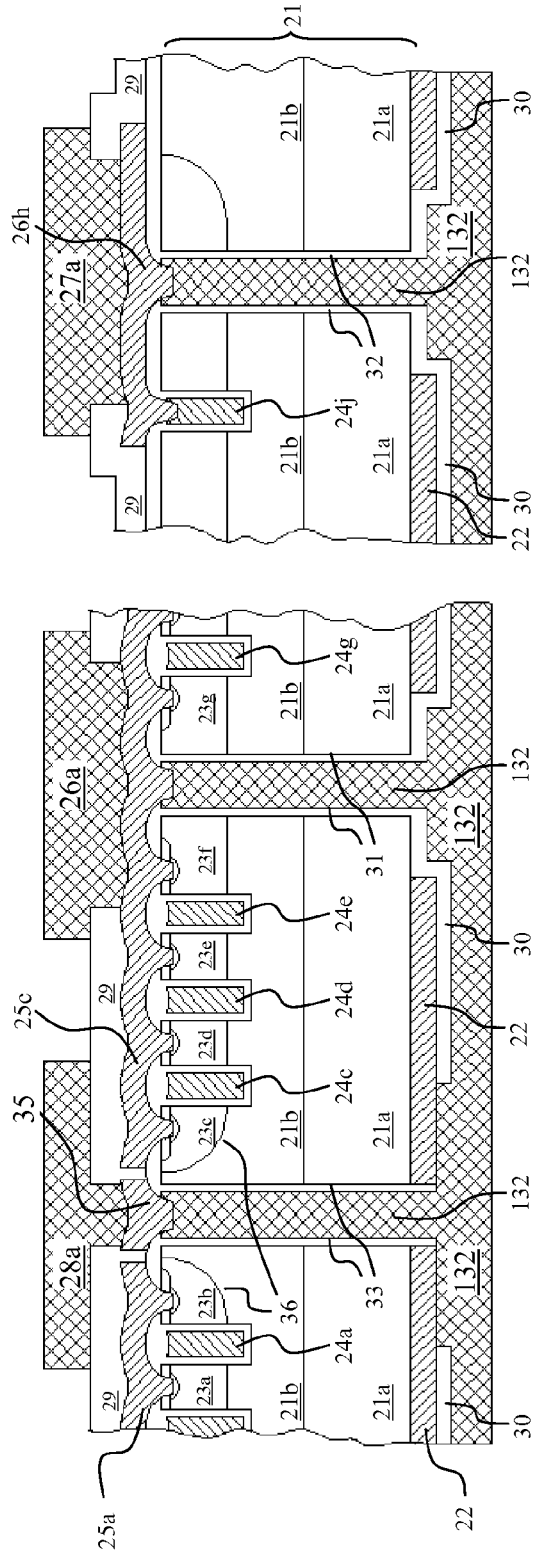
Fig. 7L Present Invention

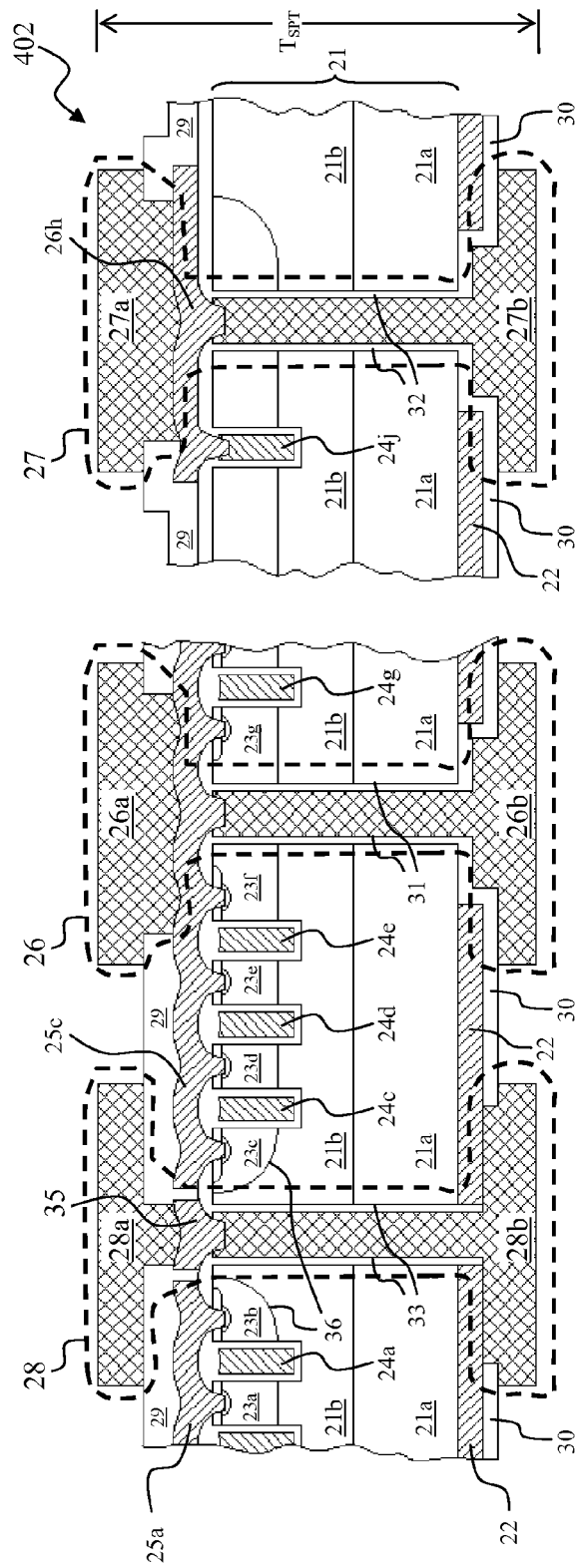
Fig. 7M Present Invention

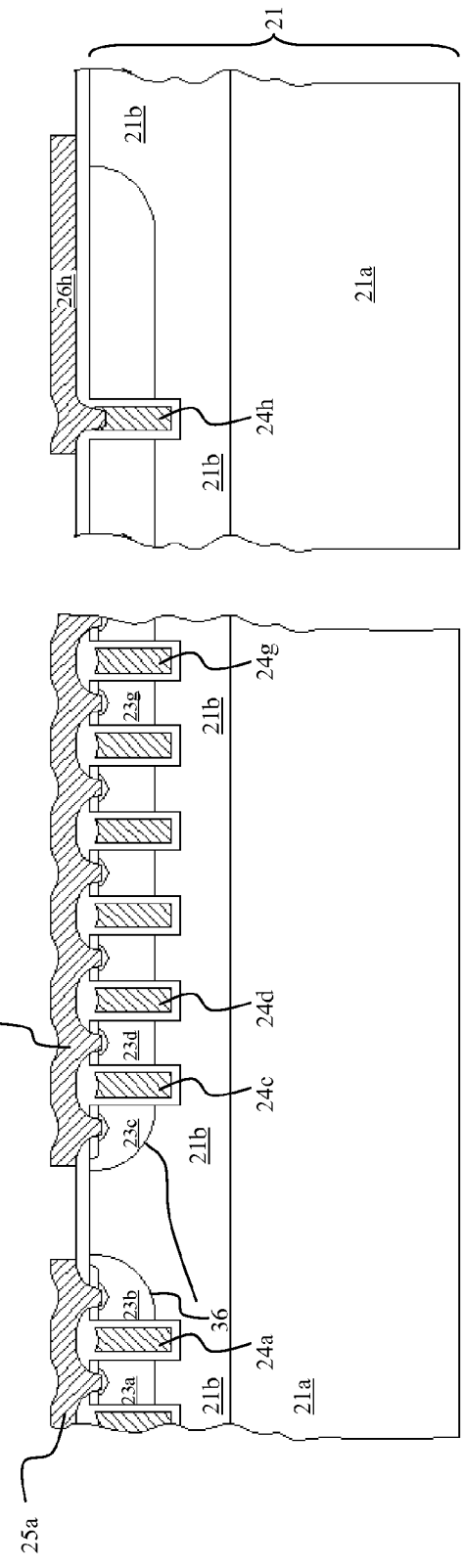
Fig. 8A Present Invention
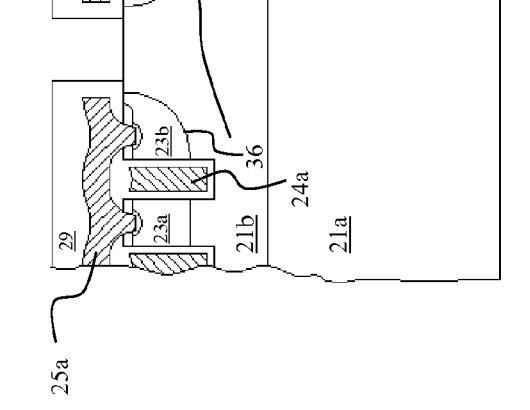
Fig. 8B Present Invention

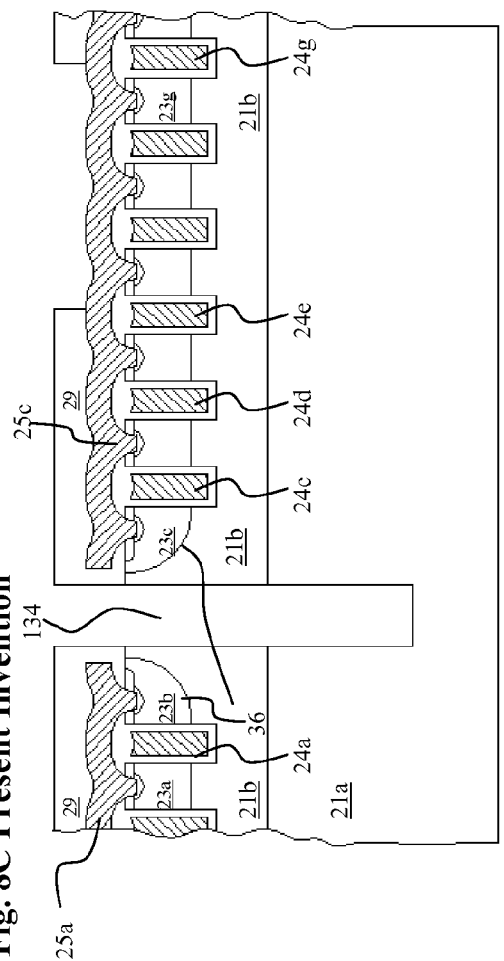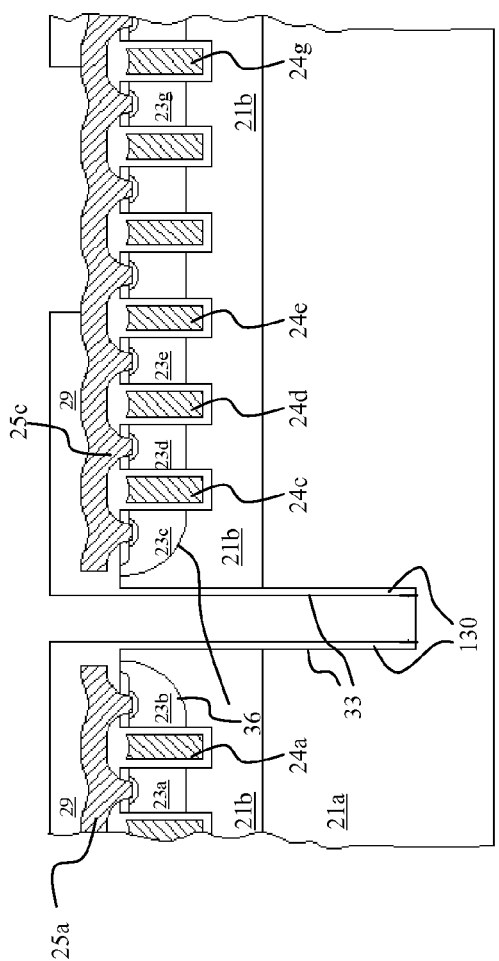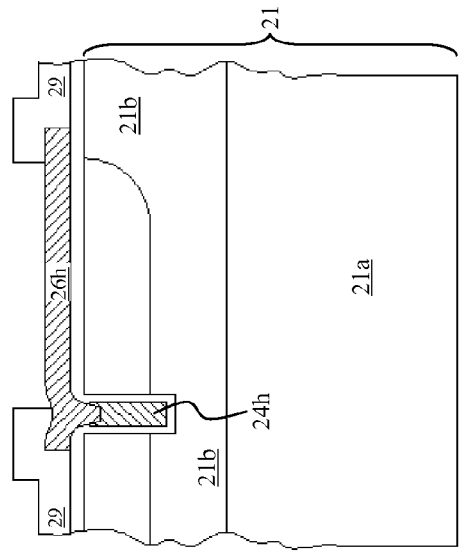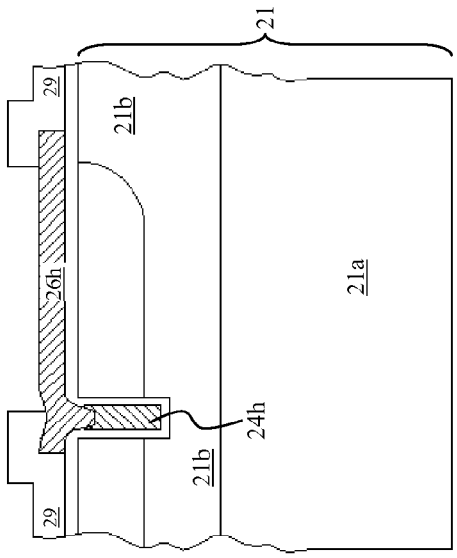
Fig. 8C Present Invention
Fig. 8D Present Invention

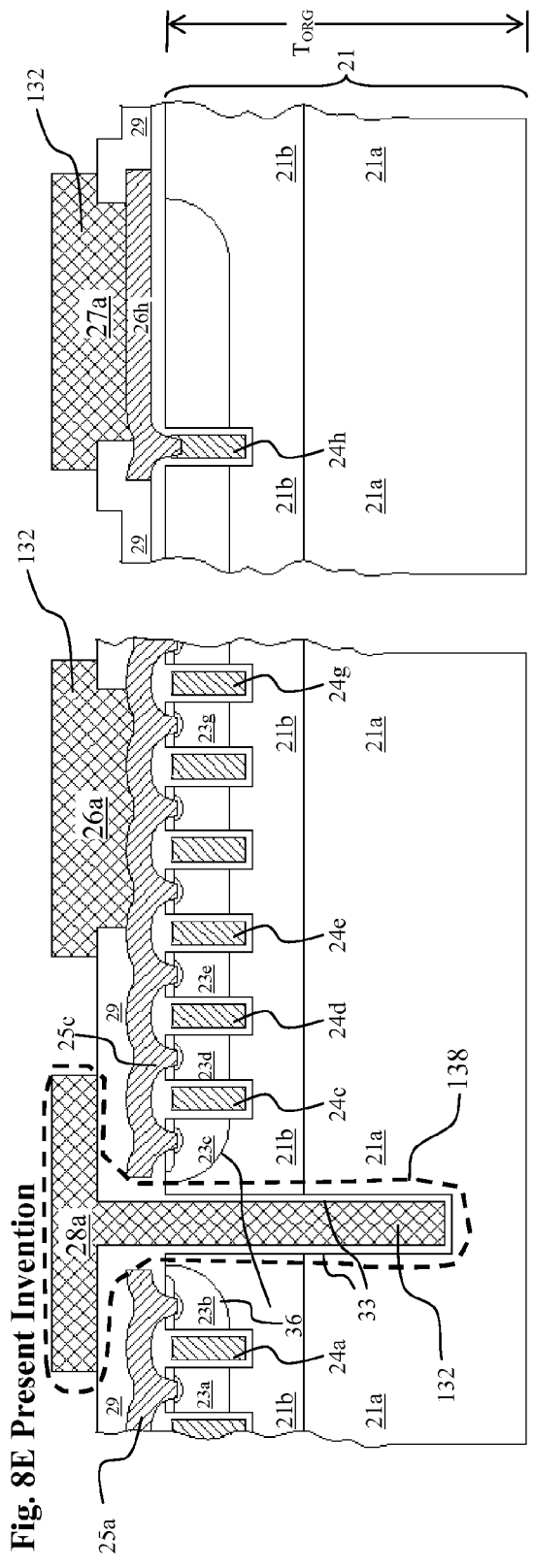
Fig. 8E Present Invention
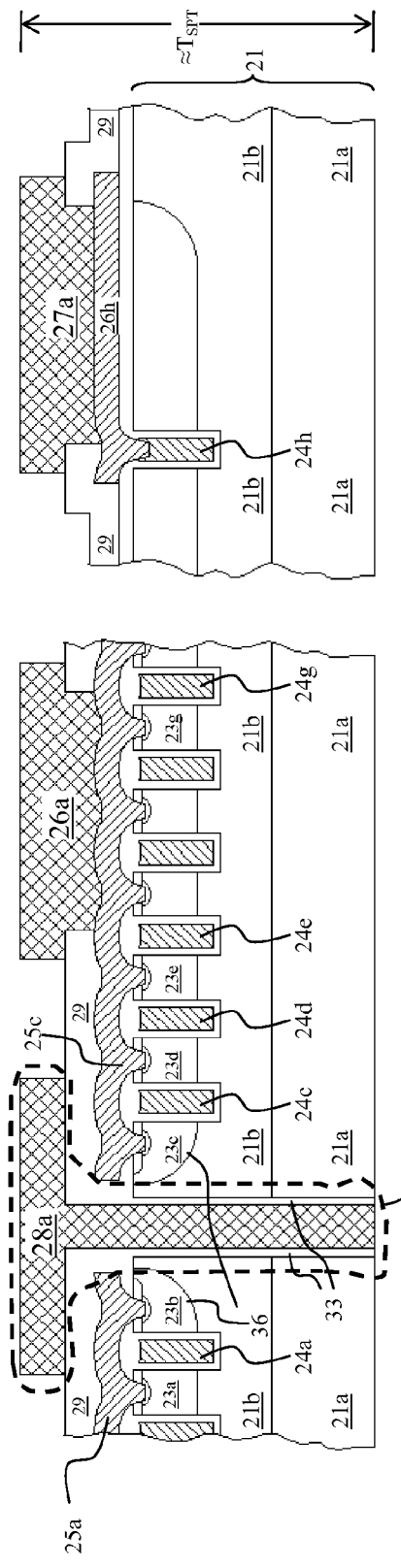
Fig. 8F Present Invention

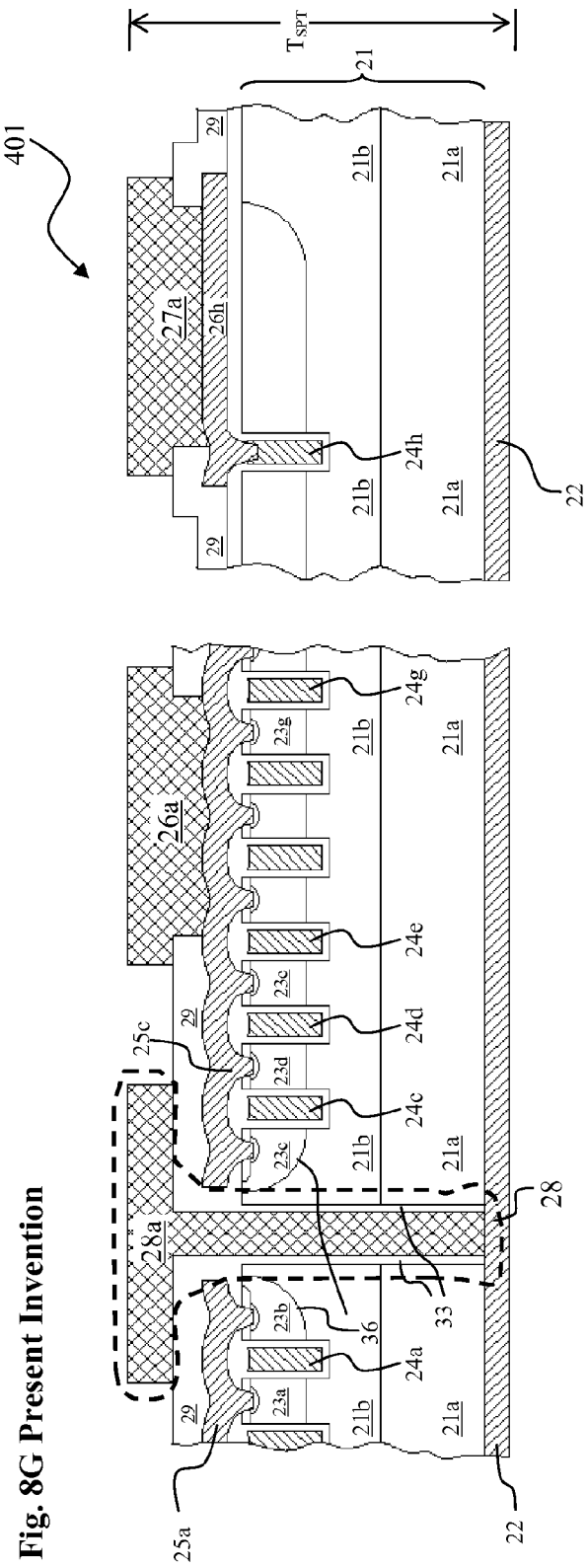
Fig. 8G Present Invention

STACKABLE POWER MOSFET, POWER MOSFET STACK, AND PROCESS OF MANUFACTURE

CROSS REFERENCE TO RELATED APPLICATIONS

This application is related to the following patent applications:

"Semiconductor package having a bridged plate interconnection" by Lei Shi et al, U.S. application Ser. No. 11/906,136, publication # US20080087992, hereafter referred to as U.S. application Ser. No. 11/906,136

"Virtually Substrate-less Composite Power Semiconductor Device and Method" by Tao Feng et al, U.S. application Ser. No. 12/749,696, hereafter referred to as U.S. application Ser. No. 12/749,696 whose contents are incorporated herein by reference for any and all purpose.

FIELD OF INVENTION

This invention relates generally to the field of semiconductor device structure. More specifically, the present invention is directed to device structure and manufacturing method to form stackable chips of power semiconductor devices, such as power Metal-Oxide-Semiconductor Field Effect Transistor (MOSFET) and Insulated Gate Bipolar Transistor (IGBT).

BACKGROUND OF THE INVENTION

A general trend of modern day electronic products, as demanded by the market place, is product miniaturization with vastly increasing functionality. The same trend also applies to the segment of power electronics. Hence, in the area of power semiconductor devices there has been an ongoing need of product miniaturization concurrent with functional requirements of reduced device internal resistance and efficient heat dissipation.

As it offers advantages of bulk device electrical resistance reduction while maintaining a small package footprint, the ability of making and stacking multiple thin chips of power semiconductor devices has become very desirable in the semiconductor industry. The following is a brief review of some prior arts for making and stacking multiple chips.

FIG. 9 is an excerpted FIG. 2 from a U.S. patent application publication # 20090108469 entitled "CHIP STACK PACKAGE" by Sun-Won KANG; et al, hereinafter referred to as US 20090108469. As seen, the chip stack package 500 of US20090108469 includes a wiring substrate 10, a plurality of chips 100, and a plurality of adhesive layers 108, wherein the chips 100 are stacked and adhered to each other by the adhesive layers 108 as intermediary media on the wiring substrate 10 by using a wafer level or chip level process. The chips 100 are electrically coupled to each other using through via electrodes 102 that are formed through the chips 100 and electrically coupled to the wiring substrate 10. The chip 100 is formed on a silicon wafer, and the through via electrodes 102 are formed through the silicon wafer. External input/output (I/O) terminals 110, each of which may be shaped like a solder ball, are formed on a bottom surface of the wiring substrate 10. The adhesive layers 108 may each be an adhesive tape.

FIG. 10 is an excerpted FIG. 1 from a U.S. patent application publication # 20090135638 entitled "SEMICONDUCTOR MEMORY DEVICE CAPABLE OF IDENTIFYING A PLURALITY OF MEMORY CHIPS STACKED IN THE SAME PACKAGE" by Yuui Shimizu, hereinafter referred to as US20090135638. Specifically, FIG. 10 is a perspective view showing the structure of a multi-chip package structure memory device (semiconductor memory device) 100 according to a first embodiment of US20090135638. Four resistance-change memory chips (hereinafter, referred to as memory chips) 111A to 111D using a resistance-change memory element as a memory cell are stacked in the same package. The memory device 100 of this embodiment includes four memory chips 111A to 111D, which are successively stacked on a package substrate 101. These four memory chips 111A to 111D each have the same configuration (specification), and stacked so that they are mutually overlapped vertically as a whole. Each of the memory chips 111A to 111D is provided with a plurality of (nine in this embodiment) pads 121 to 129 and a chip address identification circuit 150. Of those pads 121 to 129, pads 121 and 122 are used as first and second memory position detection pad P1 (Vtest), and P2 (Vss) for recognizing a chip address, respectively. Other pads 123 to 129 are used as input/output (I/O), control, power supply (Vdd) and ground (Vss) pads, respectively. The pads 121 to 129 of each of memory chips 111A to 111D are mutually connected (short-circuited) using a through via (vertical via technique) 103. For example, the pad 121 is given as one example. The through via 103 connects between the pad 121 of the memory chip 111A and the pad 121 of the memory chip 111B, between the pad 121 of the memory chip 111B and the pad 121 of the memory chip 111C and between the pad 121 of the memory chip 111C and the pad 121 of the memory chip 111D. The pad 121 of the memory chip 111A is connected to the package substrate 101 via the lowermost through via 103. Although described later, the pads 121 to 129 of each of the memory chips 111A to 111D have a through silicon via structure (TSV). According to the through silicon via structure (TSV), the pads 121 to 129 have an electrode on each of chip front and backside surfaces. The first and second memory position detection pads 121 (P1) and 122 (P2) are short-circuited. According to this embodiment, the first and second memory position detection pads 121 (P1) and 122 (P2) are connected via a package frame conductor pattern 131 between the lowermost through vias 103 on the surface of the package substrate 101. Specifically, the first and second memory position detection pads 121 (P1) and 122 (P2) of the memory chips 111A to 111D are conducted using eight through vias 103 and one conductor pattern 131. Thus, a test voltage Vtest is applied to the first and second memory position detection pad 121 (P1) of the uppermost memory chip 111D from an external tester (not shown). The second memory position detection pads 122 (P2) of the memory chip 111D is connected to ground (Vss). In this way, a current flows from the first memory position detection pads 121 (P1) of the memory chip 111D to the second memory position detection pads 122 (P2). Although is not illustrated, the memory chips 111A to 111D on the package substrate 101 are sealed by a sealer such as resin at its surroundings except the pads 121 to 129 of the uppermost memory chip 111D.

In addition to the above, the following prior arts related to direct chip stacking are noted:

U.S. patents: U.S. Pat. Nos. 5,818,107, 6,002,177, 7,217, 995, 7,446,420, 7,494,909, 7,507,637, 7,595,559, 7,598, 617.

U.S. patent application publications: US20080157357, US20090032928, US20090209063, US20090261457, US20090001543, US20090065950, US20090160051, US20090020855.

However the aforementioned prior arts are related to lateral devices which only have electrodes on the top side and do not show how to stack vertical semiconductor dies (especially power semiconductor devices) which have electrodes on both the top and the bottom. In view of the above prior arts, the present invention proposes a stackable power MOSFET structure for directly stacking power MOSFET devices (which have electrodes on both sides) to achieve high functional performance while limiting package footprint and size.

FIG. 11I and FIG. 11J are respectively excerpted FIG. 3 and FIG. 4 from a U.S. patent application publication # 20080150105 entitled "Power Semiconductor Component Stack Using Lead Technology with Surface-Mountable External Contacts and a Method for Producing the Same" by Khalil Hosseini; et al, hereinafter referred to as US20080150105. Specifically, FIG. 11A shows a schematic, opened-up, perspective view of two MOSFET power semiconductor components 2 and 3 for a parallel-connected MOSFET power semiconductor component stack 30, which is shown in FIG. 11B. In this case, in the intermediate plane 14 for a parallel-connected MOSFET power semiconductor component stack, two source electrodes S are arranged congruently one above another, and two gate external contacts G are likewise aligned congruently with respect to one another. For a parallel circuit, the two source and the two gate external contacts in the intermediate plane 14 are aligned with one another and electrically connected to one another via a soldering layer. This then results in the MOSFET power semiconductor component stack 30 shown in FIG. 11B.

FIG. 11B shows a schematic, perspective view of a parallel-connected MOSFET power semiconductor component stack 30, which has a drain external contact D, a source external contact S and a gate external contact G on its top side. In this case, the gate external contact G and the source external contact are looped through via the intermediate plane 14 down to the underside 5 of the MOSFET power semiconductor component stack 30, while a conduction strip 32 is provided for the drain external contact D on the top side 13 of the MOSFET power semiconductor component stack 30 in order to lead the drain external contact D from the top side 13 of the MOSFET power semiconductor component stack 30 to the level of the underside 5 of the MOSFET power semiconductor component stack 30. If corresponding drain external contacts are also provided in addition to the source external contacts S and the gate external contacts G in the intermediate plane 14 as shown in FIG. 3, then the conduction strip 32 can be dispensed with in the case of a series circuit.

However US20080150105 only shows a way to stack MOSFETs at packaged component level. Also, it does not show how to easily stack more than two MOSFET components.

FIG. 12 illustrates a traditional MOSFET 10 with multiple interdigitated source-body regions 23a-23i and trenched gate regions 24a-24j built on top of a semiconductor substrate 21 with a bottom drain metal layer 22. In this example, the semiconductor substrate 21 may comprise of an epitaxial layer 21b over a heavily doped substrate layer 21a. The multiple source-body regions 23a-23i are in contact and parallely connected to a patterned source-body metal layer 25c. Likewise, although not shown here with connection specifics to avoid unnecessary obscuring details, the trenched gate regions 24a-24j are in contact and parallely connected to a patterned gate metal layer 26h beneath a top passivation 29. Note that the top source metal 25c and bottom drain metal 22 are located on opposite sides of the semiconductor device, which makes it difficult to stack such devices, especially when using through vias.

SUMMARY OF THE INVENTION

A stackable vertical power MOSFET (SVP-MOSFET) device is proposed. The SVP-MOSFET has an ultra thin thickness and includes:

A semiconductor substrate with a bottom drain metal layer formed on it. As an example, the semiconductor substrate it self can include an upper lightly-doped drift layer and a lower heavily-doped contact layer for contacting the drain metal layer.

Numerous interdigitated trenched gate regions and source-body regions formed atop the semiconductor substrate.

A patterned gate metal layer and a patterned source-body metal layer respectively contacting the trenched gate regions and the source-body regions.

At least one of the following:
  a. A conductive through substrate drain via (TSDV) formed through the semiconductor substrate and in contact with the drain metal layer. The TSDV has a top drain contacting pad and a bottom drain contacting pad for respectively making a top surface and a bottom surface electrical contact to the TSDV. Correspondingly, each source-body region located next to a TSDV is formed with a source-body cut-off profile spaced sufficiently away from the TSDV to sustain a drain-source voltage in between.
  b. A conductive through substrate gate via (TSGV) formed through the semiconductor substrate and in contact with the gate metal layer. The TSGV has a top gate contacting pad and a bottom gate contacting pad for respectively making a top surface and a bottom surface electrical contact to the TSGV.
  c. A conductive through substrate source via (TSSV) formed through the semiconductor substrate and in contact with the source-body metal layer. The TSSV has a top source contacting pad and a bottom source contacting pad for respectively making a top surface and a bottom surface electrical contact to the TSSV.

Upon stacking and bonding of a number of the SVP-MOSFET devices atop one another, the thus formed SVP-MOSFET stack functions as a parallel electrical connection of the stacked SVP-MOSFET devices with a correspondingly reduced on-resistance Rds, increased current-carrying capacity, reduced package footprint and reduced package height. Furthermore, the SVP-MOSFET stack can be packaged with numerous packaging components for interconnecting the stack to its external operating environment.

In a more detailed embodiment, the TSDV, the TSGV and the TSSV are properly mapped within the major device plane of their respective SVP-MOSFET units such that, upon their stacking:

The top drain contacting pad and bottom drain contacting pad of a SVP-MOSFET unit would respectively line up with the bottom drain contacting pad and top drain contacting pad of its neighboring SVP-MOSFET units.

The top gate contacting pad and bottom gate contacting pad of a SVP-MOSFET unit would respectively line up with the bottom gate contacting pad and top gate contacting pad of its neighboring SVP-MOSFET units.

The top source contacting pad and bottom source contacting pad of a SVP-MOSFET unit would respectively line up with the bottom source contacting pad and top source contacting pad of its neighboring SVP-MOSFET units.

In a more specific embodiment, the SVP-MOSFET thickness ranges from about 5 micron to about 100 micron.

In a more specific embodiment, each of the TSDV, TSGV and TSSV is filled with copper or a metal and has a via insulating layer surrounding thus insulating it from the semiconductor substrate. The via insulating layer can be made of a semiconductor oxide, nitride, or a polymeric material. Alternatively, each of the TSDV, the TSGV and the TSSV can be made in the form of a hollow shell made of a copper or a metal.

A method of making a packaged multi-unit SVP-MOSFET stack having a number of the SVP-MOSFET units bonded atop and in parallel connection with one another is proposed. The method includes:

Fabricating a number of the SVP-MOSFET units.

Stacking and bonding the SVP-MOSFET units atop one another to form the multi-unit SVP-MOSFET stack with its parallel connection effected by the TSDV, TSGV and TSSV.

Interconnecting the stack to its external operating environment.

In a more detailed embodiment wherein each SVP-MOSFET unit has an ultra thin thickness so as to reduce the corresponding thickness and on-resistance Rds of the multi-unit SVP-MOSFET stack, the fabrication of each SVP-MOSFET unit includes:

Fabricating top portion of the SVP-MOSFET unit on a substrate wafer of an original thickness without the following:
  a. TSDV plus its bottom drain contacting pad, TSGV plus its bottom gate contacting pad, TSSV plus its bottom source contacting pad.

Attaching a temporary wafer supporting device atop the substrate wafer.

Thinning bottom of the substrate wafer till the desired ultra thin thickness and fabricating the following in parallel:
  a. TSDV plus its bottom drain contacting pad, TSGV plus its bottom gate contacting pad, TSSV plus its bottom source contacting pad.

Removing the temporary wafer supporting device.

In the above, fabricating top SVP-MOSFET portion without TSDV plus its bottom drain contacting pad includes segmenting the source-body metal layer at a desired TSDV location and forming the top drain contacting pad on it. Also, fabricating the TSDV plus its bottom drain contacting pad includes:

Forming a bottom drain metal layer and opening it up at the desired TSDV location.

Fabricating the TSDV together with its bottom drain contacting pad such that the TSDV is insulated from both the semiconductor substrate and the drain metal layer whilst in contact with both the top drain contacting pad and the bottom drain contacting pad.

In a more detailed embodiment, fabricating the TSDV plus its bottom drain contacting pad, TSGV plus its bottom gate contacting pad, TSSV plus its bottom source contacting pad in parallel includes:

Forming a bottom drain metal layer and opening it up at various desired TSDV, TSGV and TSSV locations.

Simultaneously fabricating the following:
  a. The TSDV together with its bottom drain contacting pad such that the TSDV is insulated from both the semiconductor substrate and the drain metal layer whilst in contact with both the top drain contacting pad and the bottom drain contacting pad.
  b. The TSGV together with its bottom gate contacting pad such that the TSGV is insulated from both the semiconductor substrate and the drain metal layer whilst in contact with both the top gate contacting pad and the bottom gate contacting pad.
  c. The TSSV together with its bottom source contacting pad such that the TSSV is insulated from both the semiconductor substrate and the drain metal layer whilst in contact with both the top source contacting pad and the bottom source contacting pad.

In a more detailed embodiment, fabricating the TSDV together with its bottom drain contacting pad includes:

Depositing and patterning a drain metal passivation beneath the drain metal layer while surrounding the desired TSDV location.

With the opened drain metal layer and patterned drain metal passivation as masks, directionally etching through the semiconductor substrate to create a through substrate tunnel reaching but limited by the segmented source-body metal layer.

Fabricating the TSDV inside the through substrate tunnel and the bottom drain contacting pad beneath the drain metal layer and the drain metal passivation. This further entails:
  a. Depositing a via insulating layer upon the bottom of the semiconductor substrate and upon the exposed surfaces of the through substrate tunnel.
  b. Directionally etching away all horizontally oriented layer portions of the via insulating layer to uncover the segmented source-body metal layer and the drain metal layer.
  c. Overfilling the through substrate tunnel and the patterned drain metal passivation with a conductive via material.
  d. Patterning the bottom of the conductive via material to form the bottom drain contacting pad.

In the above, fabricating top SVP-MOSFET portion without TSGV plus its bottom gate contacting pad includes forming the top gate contacting pad upon the gate metal layer. Also, fabricating the TSGV plus its bottom gate contacting pad includes:

Forming a bottom drain metal layer and opening it up at the desired TSGV location.

Fabricating the TSGV together with its bottom gate contacting pad such that the TSGV is insulated from both the semiconductor substrate and the drain metal layer whilst in contact with both the top gate contacting pad and the bottom gate contacting pad.

In a more detailed embodiment, fabricating the TSGV together with its bottom gate contacting pad includes:

Depositing and patterning a drain metal passivation beneath the drain metal layer while surrounding the desired TSGV location.

With the opened drain metal layer and patterned drain metal passivation as masks, directionally etching through the semiconductor substrate to create a through substrate tunnel reaching but limited by the gate metal layer.

Fabricating the TSGV inside the through substrate tunnel and the bottom gate contacting pad beneath the drain metal layer and the drain metal passivation. This further entails:
  a. Depositing a via insulating layer upon the bottom of the semiconductor substrate and upon the exposed surfaces of the through substrate tunnel.
  b. Directionally etching down horizontally oriented layer portions of the via insulating layer to uncover the gate metal layer.

c. Overfilling the through substrate tunnel and the patterned drain metal passivation with a conductive via material.
d. Patterning the bottom of the conductive via material to form the bottom gate contacting pad.

In the above, fabricating top SVP-MOSFET portion without TSSV plus its bottom source contacting pad includes forming the top source contacting pad upon the source-body metal layer at a desired TSSV location. Also, fabricating the TSSV plus its bottom source contacting pad includes:

Forming a bottom drain metal layer and opening it up at the desired TSSV location.

Fabricating the TSSV together with its bottom source contacting pad such that the TSSV is insulated from both the semiconductor substrate and the drain metal layer whilst in contact with both the top source contacting pad and the bottom source contacting pad.

In a more detailed embodiment, fabricating the TSSV together with its bottom source contacting pad includes:

Depositing and patterning a drain metal passivation beneath the drain metal layer while surrounding the desired TSSV location.

With the opened drain metal layer and patterned drain metal passivation as masks, directionally etching through the semiconductor substrate to create a through substrate tunnel reaching but limited by the source-body metal layer.

Fabricating the TSSV inside the through substrate tunnel and the bottom source contacting pad beneath the drain metal layer and the drain metal passivation. This further entails:
a. Depositing a via insulating layer upon the bottom of the semiconductor substrate and upon the exposed surfaces of the through substrate tunnel.
b. Directionally etching down horizontally oriented layer portions of the via insulating layer to uncover the source-body metal layer.
c. Overfilling the through substrate tunnel and the patterned drain metal passivation with a conductive via material.
d. Patterning the bottom of the conductive via material to form the bottom source contacting pad.

For the special case of a bottom stackable SVP-MOSFET unit, thinning bottom of the substrate wafer and fabricating the TSDV plus its bottom drain contacting pad includes:

Opening up the source-body metal layer at a desired TSDV location.

Fabricating a partially through substrate drain via PTSDV together with its top drain contacting pad such that:
a. The PTSDV is insulated from the semiconductor substrate.
b. The PTSDV partially penetrates into the substrate wafer but the PTSDV bottom portion will be shortened upon later thinning of the substrate wafer.

Thinning bottom of the substrate wafer till the desired ultra thin thickness with simultaneous exposure of the shortened PTSDV bottom thus creation of the TSDV.

Forming a bottom drain metal layer onto the substrate wafer.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 1 illustrates a first embodiment SVP-MOSFET of the present invention with a conductive through substrate source via, a conductive through substrate gate via and a conductive through substrate drain via;

FIG. 2A illustrates a second embodiment SVP-MOSFET of the present invention with a through substrate source via and a through substrate gate via;

FIG. 2B illustrates a third embodiment SVP-MOSFET of the present invention with only a through substrate drain via;

FIG. 2C illustrates a fourth embodiment SVP-MOSFET of the present invention that is similar to the second embodiment of FIG. 2A except for the variation of internal structure of the through substrate vias;

FIG. 2D illustrates a fifth embodiment of the present invention that is a stack of two SVP-MOSFET units;

FIG. 3A is an equivalent circuit schematic corresponding to the dual SVP-MOSFET stack of FIG. 2D;

FIG. 3B is an equivalent circuit schematic corresponding to a quadruple SVP-MOSFET stack made of four SVP-MOSFET units of the present invention;

FIG. 4 illustrates a sixth embodiment of the present invention that is a stack of three SVP-MOSFET units;

FIG. 5A through FIG. 5F illustrate top and bottom schematic views of individual SVP-MOSFET units of a generalized triple SVP-MOSFET stack of the present invention with a large number of through substrate source vias and through substrate drain vias respectively connected in parallel;

FIG. 6A is a three dimensional perspective view of only the portion of source contacting pads, gate contacting pads, drain contacting pads, through substrate source vias, through substrate gate vias and through substrate drain vias of a present invention quadruple SVP-MOSFET stack;

FIG. 6B is a three dimensional perspective view of only the portion of source contacting pads, gate contacting pads, through substrate source vias and through substrate gate vias of a present invention quadruple SVP-MOSFET stack;

FIG. 6C is a three dimensional perspective view of only the portion of drain contacting pads and through substrate drain vias of a present invention quadruple SVP-MOSFET stack;

FIG. 6D is a cross sectional illustration of a quadruple SVP-MOSFET stack packaged with a leadframe and a bonding plate;

FIG. 7A through FIG. 7M illustrate a detailed process flow for making the middle SVP-MOSFET unit of the triple SVP-MOSFET stack of FIG. 4; and FIG. 8A through FIG. 8G illustrate a detailed process flow for making the bottom SVP-MOSFET unit of the triple SVP-MOSFET stack of FIG. 4.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments.

The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 12:
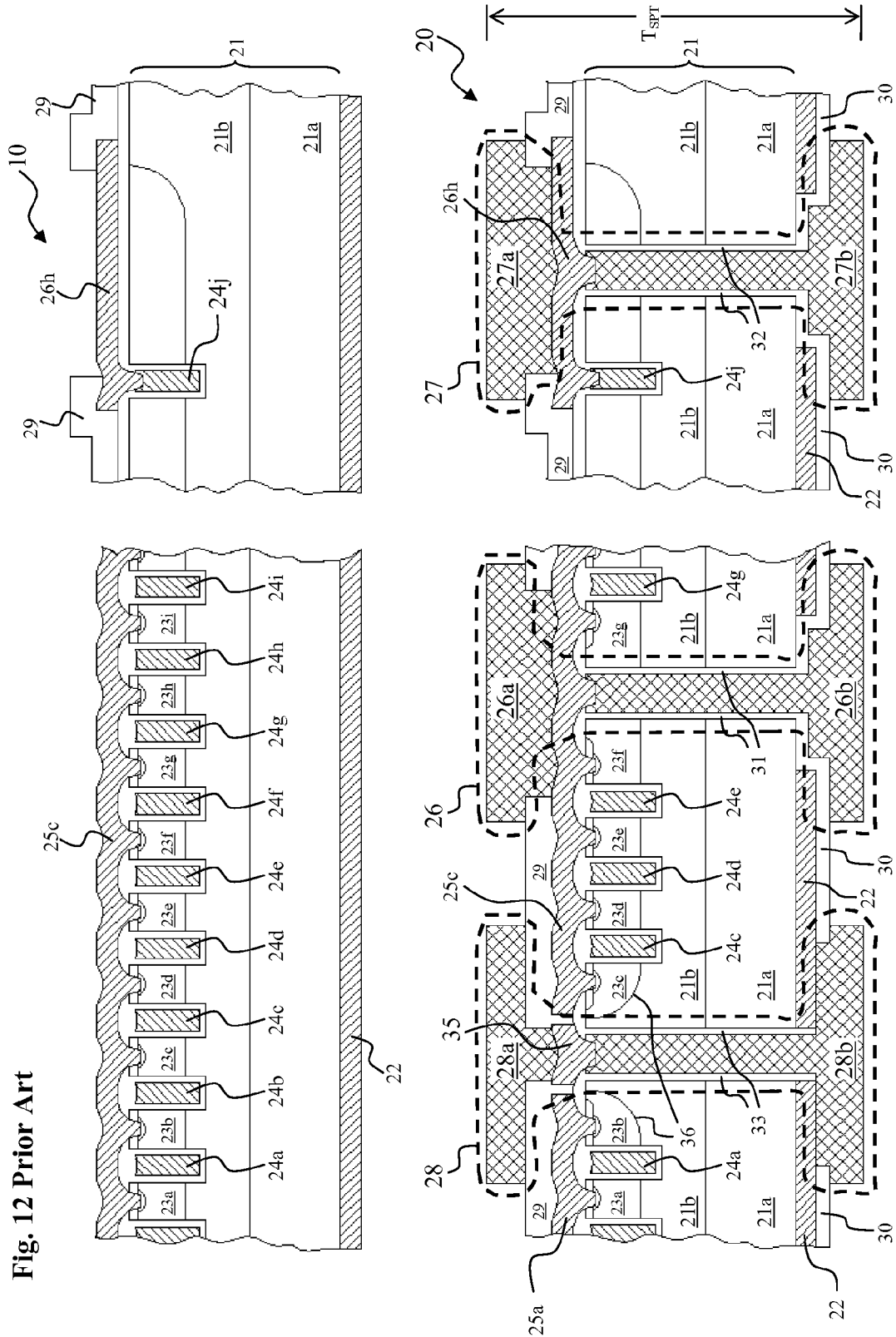
FIG. 12 illustrates a traditional multi-trench power MOSFET.
Figure 9:
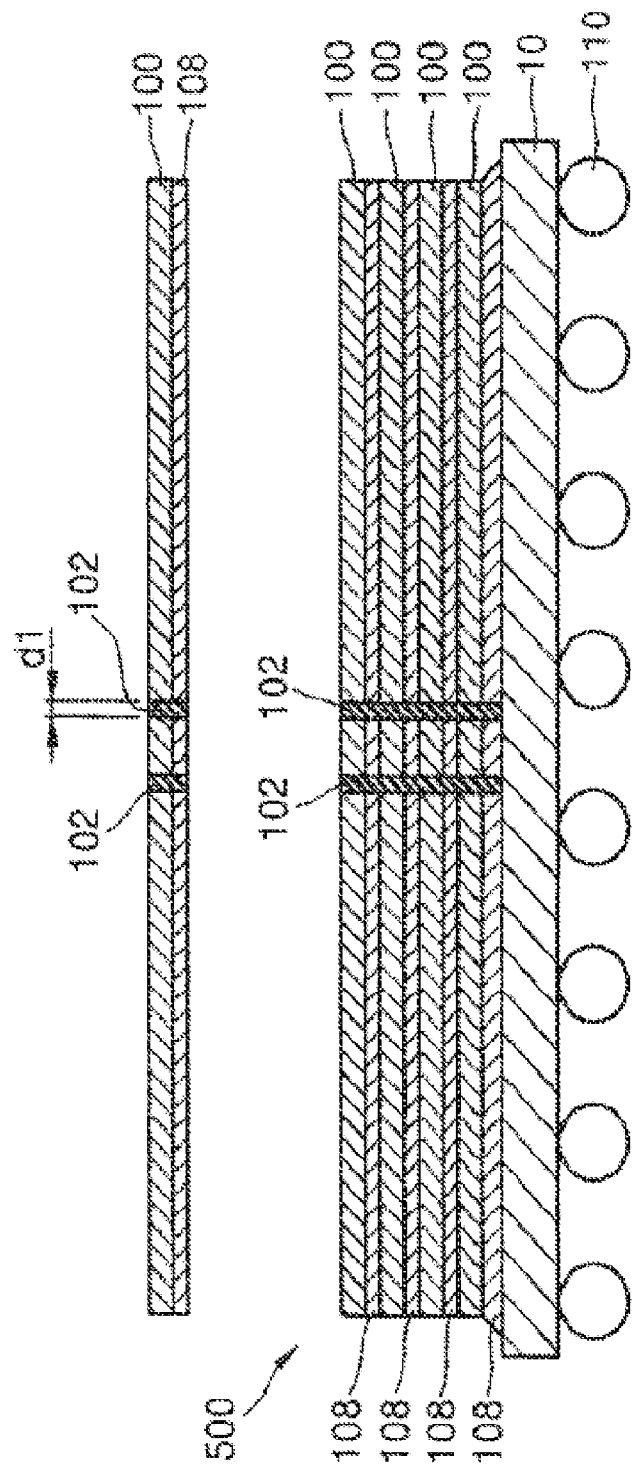
FIG. 9 is an excerpted drawing from prior art US 20090108469.
Figure 10:
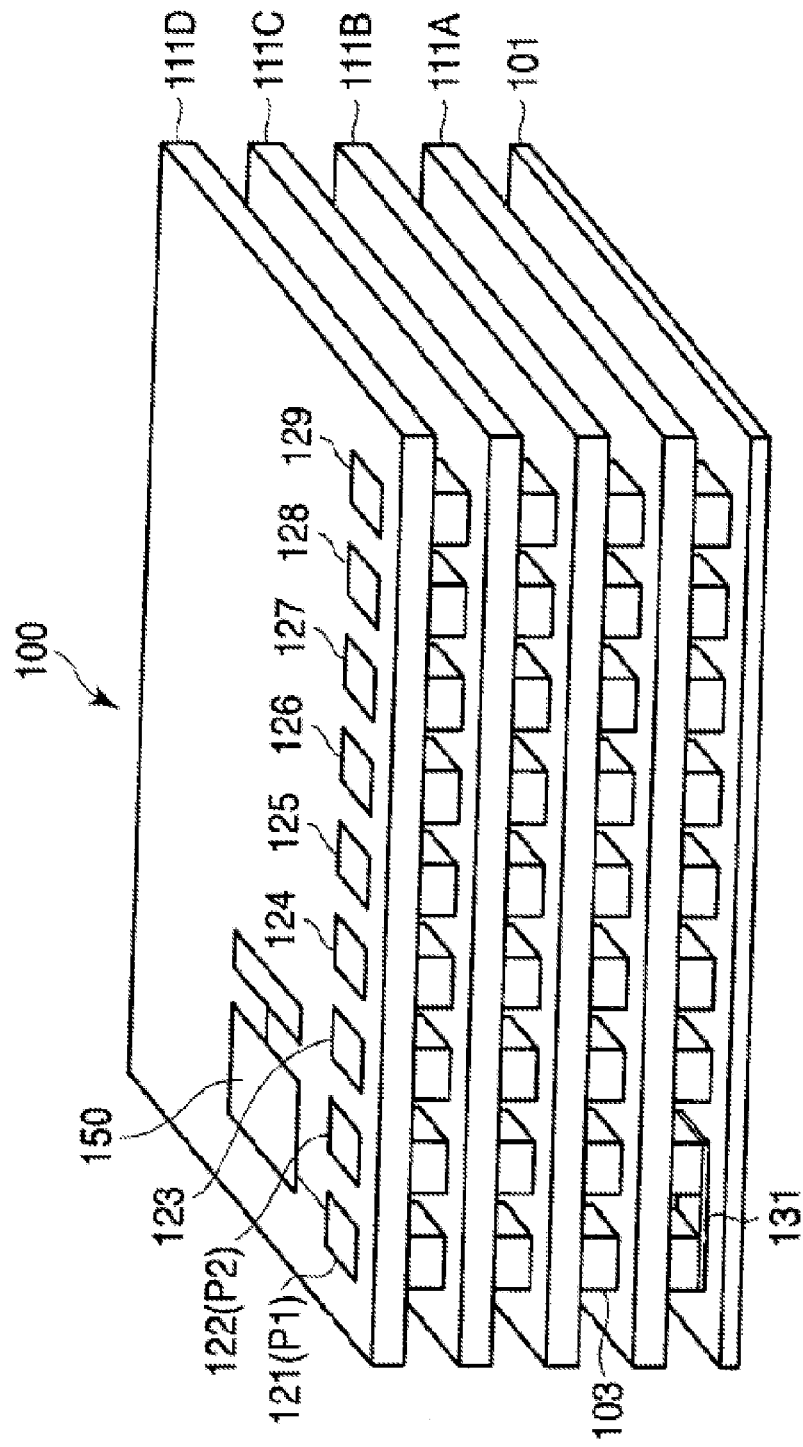
FIG. 10 is an excerpted drawing from prior art US20090135638.
Figure 11B:
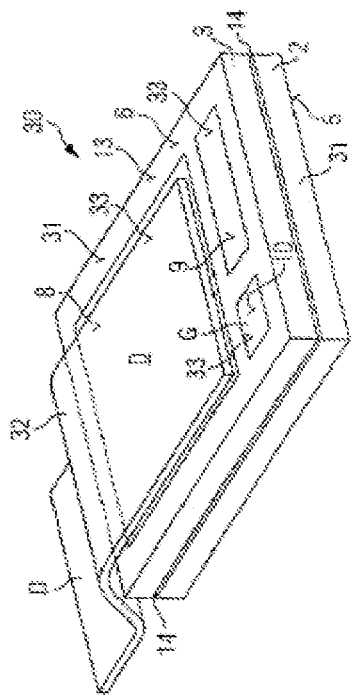
FIG. 11A and FIG. 11B are excerpted drawings from prior art US20080150105.
Figure 11A:
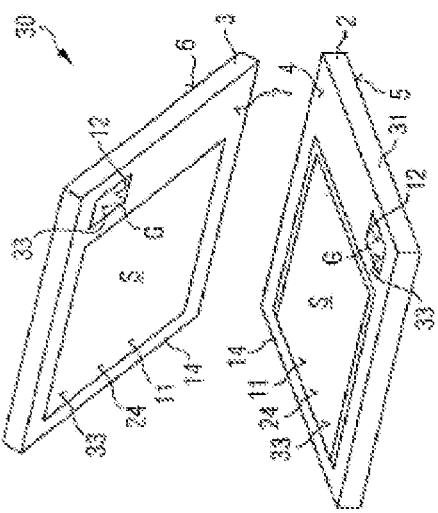

FIG. 1 illustrates a first embodiment stackable power trench MOSFET (SVP-MOSFET) 20 of the present invention. In addition to the parts common to those of the traditional power trench MOSFET 10 (compare FIG. 12 and FIG. 1), the present invention SVP-MOSFET 20 notably has a conductive through substrate source via (TSSV) 26, a conductive through substrate gate via (TSGV) 27 and a conductive through substrate drain via (TSDV) 28. In contrast with the traditional power trench MOSFET 10 that might have a typical thickness of about 200 micron, the present invention SVP-MOSFET 20 preferably has an ultra thin thickness $T_{SVP}$ in the range of, for example, from about 5 micron to about 100 micron. Specifically, the parts common to those of the traditional power trench MOSFET 10 include the following:

a. A semiconductor substrate 21 with a bottom drain metal layer 22 formed on it. As an example of more details, the semiconductor substrate 21 can be made up of an upper lightly-doped drift layer 21b and a lower heavily-doped contact layer 21a for contacting the bottom drain metal layer 22 and for supporting the semiconductor device.

b. Numerous interdigitated trenched gate regions 24a-24g and gate runner 24j and source-body regions 23a-23g formed atop the semiconductor substrate 21.

c. A patterned gate metal layer 26h contacting the trenched gate regions 24a-24g and gate runner 24j and the patterned source-body metal layers 25a, 25c contacting the source-body regions 23a-23g. The source-body metal layers 25a and 25c are connected together in the third dimension.

However, the parts differentiating the present invention SVP-MOSFET 20 include the following:

a. The conductive through substrate drain via (TSDV) 28 formed through the semiconductor substrate 21 and in contact with the bottom drain metal layer 22. The TSDV 28 has a top drain contacting pad 28a and a bottom drain contacting pad 28b for respectively making a top surface and a bottom surface electrical contact to the TSDV 28. Notice the top surface electrical contact to the TSDV 28 is via a segmented source-body metal 35 that was separated from the patterned source-body metal layers 25a and 25c. To clear the TSDV 28, both source-body regions 23b and 23c located next to the TSDV 28 are formed with a source-body cut-off profile 36 spaced sufficiently away from the TSDV 28 to sustain a drain-source voltage in between during operation of the present invention SVP-MOSFET 20.

b. The conductive through substrate gate via (TSGV) 27 formed through the semiconductor substrate 21 and in contact with the patterned gate metal layer 26h. The TSGV 27 has a top gate contacting pad 27a and a bottom gate contacting pad 27b for respectively making a top surface and a bottom surface electrical contact to the TSGV 27.

c. The conductive through substrate source via (TSSV) 26 formed through the semiconductor substrate 21 and in contact with the patterned source-body metal layer 25c. The TSSV 26 has a top source contacting pad 26a and a bottom source contacting pad 26b for respectively making a top surface and a bottom surface electrical contact to the TSSV 26.

d. The periphery of each of the top drain contacting pad 28a, top gate contacting pad 27a, top source contacting pad 26a are separated from device structures below by a top passivation 29. Also, except for a direct contact between the bottom drain contacting pad 28b and the bottom drain metal layer 22, each of the bottom gate contacting pad 27b, the bottom source contacting pad 26b are separated from the bottom drain metal layer 22 by a drain metal passivation 30.

As a more specific embodiment, each of the TSDV 28, TSGV 27 and TSSV 26 is filled with tungsten or copper, or a metal in general. The TSDV 28 has a drain via insulating layer 33 surrounding it thus insulating it from the semiconductor substrate 21. Similarly, the TSGV 27 has a gate via insulating layer 32 surrounding it thus insulating it from the semiconductor substrate 21 and the TSSV 26 has a source via insulating layer 31 surrounding it thus insulating it from the semiconductor substrate 21. The via insulating layers 33, 32, 31 can be made of a semiconductor oxide, nitride, or a polymeric material.

FIG. 2A illustrates a second embodiment SVP-MOSFET 2 302 of the present invention with a TSSV 26 and a TSGV 27. The TSSV 26 has a top source contacting pad 26a and a bottom source contacting pad 26b for respectively making a top surface and a bottom surface electrical contact to the TSSV 26. The TSGV 27 has a top gate contacting pad 27a and a bottom gate contacting pad 27b for respectively making a top surface and a bottom surface electrical contact to the TSGV 27. For making a bottom surface electrical contact to the bottom drain metal layer 22 only, the SVP-MOSFET 2 302 has a bottom drain contacting pad 28b absent a TSDV. In stacked devices, the SVP-MOSFET 2 302 may be located at the top of the stack.

FIG. 2B illustrates a third embodiment SVP-MOSFET 1 301 of the present invention with only a TSDV 28 in direct contact with the bottom drain metal layer 22, absent a bottom drain contacting pad. The TSDV 28 has a top drain contacting pad 28a for making a top surface electrical contact to the TSDV 28. For making a top surface electrical contact to the patterned source-body metal layer 25c, the SVP-MOSFET 1 301 has a top source contacting pad 26a absent a TSSV. For making a top surface electrical contact to the patterned gate metal layer 26h only, the SVP-MOSFET 1 301 has a top gate contacting pad 27a absent a TSGV. In stacked devices, the SVP-MOSFET 1 301 may be located at the bottom of the stack.

FIG. 2C illustrates a fourth embodiment SVP-MOSFET 2 302a of the present invention that is similar to the second embodiment SVP-MOSFET 2 302 of FIG. 2A except for the variation of internal structure of the through substrate vias in that, instead of a solid conductive core, the TSGV 27 has a hollow shell conductive core 40 plus the gate via insulating layer 32 and the TSSV 26 has a hollow shell conductive core 38 plus the source via insulating layer 31. Both hollow shell conductive core 40 and hollow shell conductive core 38 may be made of Tungsten, copper or a metal. Thus, the hollow shell conductive core 40 is a conductive layer that lines, through the gate via insulating layer 32 on the sidewalls of the TSGV 27. While a shell conductive core exhibits an electrical resistance higher than that of a solid conductive core made of the same material, for as long as the shell conductive core resistance is still much lower than the device internal resistance of the SVP-MOSFET 2 302a a low through-substrate resistance is still maintained. Under this situation, the shell conductive core can provide the advantages of reduced material consumption and reduced built-in material stress and under some circumstances, easier manufacturability compared to an otherwise solid conductive core.

FIG. 2D illustrates a fifth embodiment of a dual SVP-MOSFET stack 300 that is a stack of two SVP-MOSFET units SVP-MOSFET 1 301 of FIG. 2B and SVP-MOSFET 2 302 of FIG. 2A. Here, the TSDV 28, TSGV 27 and TSSV 26 have been properly mapped within the major device plane (X-Y plane) of their respective SVP-MOSFET units such that, upon their stacking:

a. The top drain contacting pad 28a of SVP-MOSFET 1 301 lines up with the bottom drain contacting pad 28b of SVP-MOSFET 2 302.

b. The top source contacting pad 26a of SVP-MOSFET 1 301 lines up with the bottom source contacting pad 26b of SVP-MOSFET 2 302.

c. The top gate contacting pad 27a of SVP-MOSFET 1 301 lines up with the bottom gate contacting pad 27b of SVP-MOSFET 2 302.

FIG. 3A is a dual parallel MOSFET equivalent circuit schematic 352 corresponding to the dual SVP-MOSFET stack 300 of FIG. 2D. Notice that, while the two SVP-MOSFET units FET1 and FET2 (SVP-MOSFET 1 301 and SVP-MOSFET 2 302 in FIG. 2D) are electrically connected in parallel, all the physical interconnecting elements do present a finite amount of parasitic interconnecting resistance between FET1 and FET2. For example, the parasitic drain-interconnecting resistance Rdv comes from the TSDV 28 of SVP-MOSFET 1 301. For another example, the parasitic gate-interconnecting resistance Rgv comes from the TSGV 27 of SVP-MOSFET 2 302. For a third example, the parasitic source-interconnecting resistance Rsv comes from the TSSV 26 of SVP-MOSFET 2 302, etc. FIG. 3B is a quadruple parallel MOSFET equivalent circuit schematic 354 corresponding to a quadruple SVP-MOSFET stack made of four SVP-MOSFET units (FET1, FET2, FET3, FET4) of the present invention. As the parasitic interconnecting resistances from the various through substrate vias of individual SVP-MOSFET all contribute to the total resistance, the corresponding interconnecting resistance tends to increase with the number of stacking SVP-MOSFET units.

Therefore, another important idea of the present invention is to create multiple, parallely connected through substrate vias to reduce the interconnecting resistance and this will be presently described. In addition, the via resistances (e.g. Rsv) are also reduced by making the through vias out of a highly conductive material such as metal. In these circuits, there are also the internal gate resistances $R_g$ that are present in all MOSFETs when routing signals from the gate pad to the gate trench electrodes.

FIG. 4 illustrates a sixth embodiment of a triple SVP-MOSFET stack 400 that is a stack of three SVP-MOSFET units SVP-MOSFET 1 401, SVP-MOSFET 2 402 and SVP-MOSFET 3 403. SVP-MOSFET 1 401 corresponds to SVP-MOSFET 301 of FIG. 2B, SVP-MOSFET 3 402 corresponds to SVP-MOSFET 20 of FIG. 1, and SVP-MOSFET 3 403 corresponds to SVP-MOSFET 302 of FIG. 2A Here again, the TSDV 28, TSGV 27 and TSSV 26 have been properly mapped within the major device plane (X-Y plane) of their respective SVP-MOSFET units such that, upon their stacking:

a. The top drain contacting pad 28a of SVP-MOSFET 1 401 lines up with the bottom drain contacting pad 28b of SVP-MOSFET 2 402; the top drain contacting pad 28a of SVP-MOSFET 2 402 lines up with the bottom drain contacting pad 28b of SVP-MOSFET 3 403.

b. The top source contacting pad 26a of SVP-MOSFET 1 401 lines up with the bottom source contacting pad 26b of SVP-MOSFET 2 402; the top source contacting pad 26a of SVP-MOSFET 2 402 lines up with the bottom source contacting pad 26b of SVP-MOSFET 3 403.

c. The top gate contacting pad 27a of SVP-MOSFET 1 401 lines up with the bottom gate contacting pad 27b of SVP-MOSFET 2 402; the top gate contacting pad 27a of SVP-MOSFET 2 402 lines up with the bottom gate contacting pad 27b of SVP-MOSFET 3 403.

Whereas, the top source contacting pad 26a of conductive through substrate source via (TSSV) 46 of the SVP-MOSFET 3 403 serves for making an external source contact to the triple SVP-MOSFET stack 400. Likewise, the top gate contacting pad 27a of conductive through substrate gate via (TSGV) 47 of the SVP-MOSFET 3 403 serves for making an external gate contact to the triple SVP-MOSFET stack 400.

By now it should become clear to those skilled in the art that the various top and bottom contacting pads (26a, 26b, 27a, 27b, 28a, 28b) can be implemented in other forms such as bumps and multiple spherical contacts as long as they serve the same purpose of SVP-MOSFET stacking. These contacting pads can be made of copper, metal and/or a solder material for copper-copper direct bonding or solder-solder bonding. However, for the bottom SVP-MOSFET 1 401, the bottom drain metal layer 22 at the bottom of conductive through substrate drain via (TSDV) 48 already serves the purpose of external contact.

As mentioned before, an important aspect of the present invention is to create multiple, parallelly connected through substrate vias to reduce the total interconnecting resistance and this is illustrated in FIG. 5A through FIG. 5F for a generalized triple SVP-MOSFET stack like stack 400 of FIG. 4. FIG. 5A and FIG. 5B are respectively top and bottom schematic views of its top SVP-MOSFET unit. FIG. 5C and FIG. 5D are respectively top and bottom schematic views of its middle SVP-MOSFET unit. FIG. 5E and FIG. 5F are respectively top and bottom schematic views of its bottom SVP-MOSFET unit. Thus, FIG. 5A illustrates top gate contacting pad 27a and top source contacting pad 26a. FIG. 5B, FIG. 5C, FIG. 5D and FIG. 5E show, in top and bottom views parallel to the X-Y plane, a TSGV 27, an interdigitated array of twenty three (23) TSDVs 28 and twenty four (24) TSSVs 26, and FIG. 5F shows bottom drain metal layer 22 of the bottom SVP-MOSFET unit. The twenty three (23) TSDVs 28 are connected in parallel through the bottom drain metal layer 22 of each SVP-MOSFET unit while the twenty four (24) TSSVs 26 are connected in parallel through the top source contacting pad 26a and through the top source metals (not shown) of each SVP-MOSFET unit. While this scheme of parallel connection is clearly applicable to the through substrate gate vias as well, it is not done in this example as the gate current of an MOSFET device is typically far lower than those of the drain and source electrodes so a single gate via should be sufficient. The source and drain vias are interdigitated to allow for through substrate connections with reduced lateral spreading resistance and without shorting the source to the drain. In essence, by stacking and bonding a number of the present invention ultra thin SVP-MOSFET devices having interdigitated through vias atop one another, the thus formed SVP-MOSFET stack functions as a parallel electrical connection of the stacked SVP-MOSFET devices with a correspondingly reduced on-resistance Rds, increased current-carrying capacity, reduced package footprint and about the same package height as before. The source and drain through vias are interdigitated and arranged throughout the die to allow for through substrate connections with reduced lateral spreading resistance and without shorting the source to the drain.

FIG. 6A through FIG. 6C illustrate, with three dimensional perspective views, another example of using multiple, parallely connected through substrate vias to reduce the total interconnecting resistance and to reduce spreading resistance for a generalized quadruple SVP-MOSFET stack 600 made of SVP-MOSFET 1 601, SVP-MOSFET 2 602, SVP-MOSFET 3 603 and SVP-MOSFET 4 604 each with its own top source contacting pad 26a and bottom drain contacting pad 28b. The gate connection is made through four top gate contacting pads 27a linked with a single conductive through substrate gate via (TSGV) 47. For visual clarity, FIG. 6A only shows the portion of source contacting pads, gate contacting pads, drain contacting pads, through substrate source vias, through substrate gate vias and through substrate drain vias of the quadruple SVP-MOSFET stack 600. Thus, the parallely connected TSDV are 48 and the parallely connected TSSV are 46. Similarly for visual clarity, FIG. 6B only shows the portion of source contacting pads, gate contacting pads, through substrate source vias and through substrate gate vias of the quadruple SVP-MOSFET stack 600. Similarly for visual clarity, FIG. 6C only shows the portion of drain contacting pads and through substrate drain vias of the quadruple SVP-MOSFET stack 600. Note that the TSSV 46 are able to pass through drain contacting pads 28b without contacting them, and likewise the TSDV 48 are able to pass through the source contacting pads 26a without contacting them. Thus, interdigitated source and drain vias can be formed to parallely connect the sources and drains, respectively, of stacked MOSFETs with reduced spreading resistance and without shorting source to drain.

FIG. 6D is a cross sectional illustration of a packaged multi-unit power MOSFET stack 500 wherein the quadruple SVP-MOSFET stack 600 of FIG. 6A has been packaged for functioning in an external operating environment with a leadframe 502 and a bonding plate 506 (described in U.S. application Ser. No. 11/906,136). While the quadruple SVP-MOSFET stack 600 is shown bonded via a die bonding material 504 (such as solder or conductive epoxy) atop the leadframe 502, the leadframe 502 can instead be replaced with other types of circuit substrates such as a printed circuit board (PCB) or in general a multi-layer circuit laminate. Likewise, the bonding plate 506 can be replaced with other packaging elements such as bonding wires. Additionally, while not shown here, the packaged multi-unit power MOSFET stack 500 can be encapsulated with a molding compound as well. As mentioned before, in contrast with a traditional MOSFET 10 that might have a typical thickness about 200 micron, each of the present invention SVP-MOSFET units (SVP-MOSFET 1 601, SVP-MOSFET 2 602, SVP-MOSFET 3 603, SVP-MOSFET 4 604) preferably has an ultra thin thickness $T_{SVP}$ from about 5 micron to about 100 micron. As a result, the packaged multi-unit power MOSFET stack 500 offers the advantages of very low Rdson with a small package footprint with about the same package height as before. A further advantage is that both the multiple, parallely connected conductive TSDVs 48 and the conductive TSSVs 46 function to localize lateral current flow (parallel to the X-Y plane) within the source metal and the drain metal of each MOSFET. This will reduce an associated spreading resistance.

FIG. 7A through FIG. 7M illustrate a detailed process flow for making the middle SVP-MOSFET unit SVP-MOSFET 2 402 of the triple SVP-MOSFET stack 400 of FIG. 4 (see also SVP-MOSFET unit 20 of FIG. 1). Out of this process, the portion from FIG. 7A through FIG. 7E illustrates the fabrication of top portion of the SVP-MOSFET 2 402 on a substrate wafer of an original thickness without the following:

TSDV plus its bottom drain contacting pad, TSGV plus its bottom gate contacting pad, TSSV plus its bottom source contacting pad.

Next, the portion from FIG. 7F through FIG. 7M illustrates thinning the bottom of the substrate wafer till the desired ultra thin thickness and fabricating the following in parallel:

TSDV plus its bottom drain contacting pad, TSGV plus its bottom gate contacting pad, TSSV plus its bottom source contacting pad.

In FIG. 7A numerous interdigitated source-body regions 23a-23g and trenched gate regions 24a-24h covered with a passivation layer 34 are fabricated atop a semiconductor substrate 21 of an original thickness $T_{ORG}$. As a typical example, the semiconductor substrate 21 has a lower heavily-doped contact layer 21a and an upper lightly-doped drift layer 21b. An example material of the passivation layer 34 is borophosphosilicate glass (BPSG). Notice that the source-body regions 23b, 23c are both formed with a source-body cut-off profile 36 reserved for clearing a later formed TSDV in between. The source-body regions 23f, 23g are formed without a gate trench or a source region in the middle in order to reserve a clearance for a later formed TSSV.

In FIG. 7B the passivation layer 34 has been patterned into gate passivation segments corresponding to the source-body regions 23a-23g and the trenched gate regions 24a-24h, followed by source-body contact etch and body contact implant.

In FIG. 7C top metal was deposited, followed by patterning it to create patterned gate metal layer 26h, patterned source-body metal layer 25a and patterned source-body metal layer 25c with a segmented top drain metal 35 in between and positioned at the location of a later TSDV. For those skilled in the art, it is remarked that the source-body metal layers 25a and 25c are connected together in the third dimension.

In FIG. 7D a top passivation layer was deposited, followed by patterning it to create patterned top passivation elements 29a, 29b, 29c, 29d bordering the patterned source-body metal layer 25c, the segmented source-body metal 35 and the patterned gate metal layer 26h. The top passivation elements 29a-29d can be made of an oxide, a nitride or both.

In FIG. 7E top drain contacting pad 28a, top source contacting pad 26a and top gate contacting pad 27a are simultaneously formed on top such that the top drain contacting pad 28a contacts the segmented top drain metal 35, the top source contacting pad 26a contacts the patterned source-body metal layer 25c and the top gate contacting pad 27a contacts the patterned gate metal layer 26h. This can be done, for example, by sputtering a seed layer, plating copper atop the seed layer then patterning the plated copper. Alternatively, an electroless, mask-less nickel-gold plating process can be used instead. Afterwards, an optional chemical mechanical polishing (CMP) and/or annealing process can be used to level and smooth the top surfaces and to relieve internal material stresses.

In FIG. 7F a temporary support device (not shown) is optionally attached atop the device-in-progress followed by bottom thinning the semiconductor substrate 21 from original thickness $T_{ORG}$ to about the desired ultra thin thickness $T_{SVP}$ of, for example, about 5 micron to about 100 micron. The attachment of a temporary support device to a semiconductor device-in-progress to facilitate thinning down its back side per se is well known in the art. As examples, one can attach a glass plate or a silicon wafer to the top side of the device-in-progress.

In FIG. 7G a bottom drain metal layer 22 is deposited on the device-in-progress then patterned into drain metal elements 22a-22d with openings in between to accommodate for various TSDV, TSSV and TSGV later. As a specific example, the bottom drain metal layer 22 can be deposited through backside etching followed by back-side metal deposition with interface titanium then aluminum.

In FIG. 7H a bottom drain metal passivation 30, for example an oxide, is deposited on the device-in-progress then patterned into drain metal passivation elements 30a-30d.

In FIG. 7I through substrate tunnels 128, 126, 127 are created by directionally etching through the semiconductor substrate 21, with the patterned drain metal elements 22 and drain metal passivation elements 30 acting as hard masks. Observe that the through substrate tunnel 128 reaches but is limited by the segmented top drain metal 35 and passivation layer 34. Similarly, the through substrate tunnel 126 reaches but is limited by the patterned source-body metal layer 25c and the passivation layer 34. Similarly, the through substrate tunnel 127 reaches but is limited by the patterned gate metal layer 26h and the passivation layer 34.

In FIG. 7J a bottom via insulating layer 130, for example an oxide or a polymeric material, is deposited upon the device-in-progress, i.e., upon the bottom of semiconductor substrate 21 and drain metal 22 and passivation 30 and upon the exposed surfaces of the through substrate tunnels 128, 126, 127.

In FIG. 7K all horizontally oriented layer portions of the via insulating layer 130 are directionally etched away, for example with a directional plasma etching process, to uncover the segmented top drain metal 35, the patterned source-body metal layer 25c, the patterned gate metal layer 26h and the drain metal elements 22, leaving drain via insulating layer 33, source via insulating layer 31 and gate via insulating layer 32 respectively upon the sidewalls of the through substrate tunnels 128, 126, 127.

In FIG. 7L the through substrate tunnels 128, 126, 127, the drain metal passivation 30 and the drain metal 22 are overfilled with a conductive via material 132. As a process example, a seed layer can first be sputtered upon all exposed bottom surfaces of the device-in-progress. A thick metal is then plated upon the seed layer till the plated thick metal fills up and forms the conductive via material 132. As a material example, the thick metal is copper and the seed layer is made of titanium and copper. Optionally, the bottom surface of the conductive via material 132 can be planarized with CMP and the device-in-progress annealed to relieve its internal stress. As another Option, the vias may be filled with a first metallization step, and then the bottom contacting pads may be formed over the vias with a second metallization step.

In FIG. 7M the bottom of the conductive via material 132 is patterned to form the desired bottom drain contacting pad 28b, bottom source contacting pad 26b and bottom gate contacting pad 27b being respectively part of the TSDV 28, TSSV 26 and TSGV 27. The temporary support device may then be removed from the device-in-progress to form the final SVP-MOSFET 2 402 of thickness $T_{SVP}$. Notice, as intended:
  a. The TSDV 28 is insulated from the semiconductor substrate 21 and the top source contacting pad 26a whilst in contact with the drain metal layer 22, the top drain contacting pad 28a and the bottom drain contacting pad 28b.
  b. The TSSV 26 is insulated from both the semiconductor substrate 21 and the bottom drain metal layer 22 whilst in contact with both the top source contacting pad 26a and the bottom source contacting pad 26b.
  c. The TSGV 27 is insulated from both the semiconductor substrate 21 and the bottom drain metal layer 22 whilst in contact with both the top gate contacting pad 27a and the bottom gate contacting pad 27b.

FIG. 8A through FIG. 8G illustrate a detailed, simplified process flow for making the bottom SVP-MOSFET unit SVP-MOSFET 1 401 of the triple SVP-MOSFET stack 400 of FIG. 4. The process is simplified as the bottom SVP-MOSFET unit 401 has no need for TSSV 26 nor TSGV 27.

FIG. 8A is similar to FIG. 7C except for the absence of segmented top drain metal 35 (FIG. 7C) and an increased number of interdigitated source-body regions and trenched gate regions. Thus, to those skilled in the art, the device-in-progress of FIG. 8A can be made with the same process as FIG. 7C except for using a correspondingly adjusted mask set. Notice the opening in the source-body metal layer between patterned source-body metal layer 25a and patterned source-body metal layer 25c reserved for a future TSDV.

FIG. 8B through FIG. 8E illustrate the fabrication, of a partially through substrate drain via PTSDV 138 together with its top drain contacting pad 28a.

In FIG. 8B a top passivation layer was deposited, followed by patterning it to create patterned top passivation elements 29 bordering the patterned source-body metal layer 25a, the patterned source-body metal layer 25c and the patterned gate metal layer 26h. The top passivation elements 29a-29d can be made of an oxide, a nitride or both.

In FIG. 8C an in-substrate trench 134 is created by directionally and partially etching into the semiconductor substrate 21, with the top passivation elements 29, the patterned source-body metal layer 25c and the patterned gate metal layer 26h acting as hard masks.

In FIG. 8D a via insulating layer 130, for example an oxide or a polymeric material, is deposited atop the device-in-progress including the exposed surfaces of the in-substrate trench 134, and then anisotropically etched back to remove the horizontal portions of it while leaving drain via insulating layer 33 on the sidewalls of the in-substrate trench 134.

In FIG. 8E the in-substrate trench 134 and the top passivation 29 are overfilled with a conductive via material 132 to create a partially through substrate drain via PTSDV 138 insulated from the semiconductor substrate 21 with the via insulating layer 130. The top of conductive via material 132 is then patterned to form the desired top drain contacting pad 28a, top source contacting pad 26a and top gate contacting pad 27a with the top drain contacting pad 28a being part of the PTSDV 138. Notice that all process steps from FIG. 8A through FIG. 8E are carried out on a semiconductor substrate 21 of an original thickness $T_{ORG}$.

In FIG. 8F the thickness of semiconductor substrate 21 is reduced by bottom thinning to about the desired ultra thin thickness $T_{SVP}$. As the PTSDV 138 was designed to partially penetrate into the semiconductor substrate 21 such that the PTSDV bottom portion will be reached upon later thinning of the semiconductor substrate 21 to about $T_{SVP}$, bottom thinning will simultaneously expose the shortened PTSDV bottom for external contact. Since no further processing besides back etch and back metallization is needed for the bottom die, (i.e., no further conductive through vias need to be formed), a temporary support device is not really needed in this case. Nevertheless, a temporary support device may still be optionally used if so desired.

In FIG. 8G a bottom drain metal layer 22 is formed onto the thinned semiconductor substrate 21. The final SVP-MOSFET 1 401 has thickness $T_{SVP}$ and a through substrate drain via 28. With the above detailed description of processes for making the middle SVP-MOSFET 2 402 and bottom SVP-MOSFET 1 401 of the triple SVP-MOSFET stack 400 of FIG. 4, it should become clear to those skilled in the art how to make the top SVP-MOSFET 3 403 of the triple SVP-MOSFET stack 400 as well.

While the description above contains many specificities, these specificities should not be constructed as accordingly limiting the scope of the present invention but as merely providing illustrations of numerous presently preferred embodiments of this invention. For example, in addition to MOSFET, the present invention expects to be applicable to vertical power semiconductor devices in general where the device current flows primarily between its front-face and back substrate, such as an Insulated Gate Bipolar Transistor (IGBT).

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

I claim:

1. A stackable vertical power MOSFET (SVP-MOSFET) device comprising:
    a semiconductor substrate with a bottom drain metal layer formed thereon;
    a plurality of gate regions and source-body regions formed atop the semiconductor substrate;
    a patterned gate metal layer and a patterned source-body metal layer respectively connecting the gate regions and the source-body regions; and:
        a conductive through substrate drain via (TSDV), formed through the semiconductor substrate but insulated there from whilst in contact with the drain metal layer, having a top drain contacting means and a bottom drain contacting means for respectively making a top surface and a bottom surface electrical contact to the TSDV;
        a conductive through substrate gate via (TSGV), formed through the semiconductor substrate but insulated there from whilst in contact with the gate metal layer, having a top gate contacting means and a bottom gate contacting means for respectively making a top surface and a bottom surface electrical contact to the TSGV; and
        a conductive through substrate source via (TSSV), formed through the semiconductor substrate but insulated there from whilst in contact with the source-body metal layer, having a top source contacting means and a bottom source contacting means for respectively making a top surface and a bottom surface electrical contact to the TSSV
    whereby, upon stacking of a plurality of the SVP-MOSFET devices, the thus formed SVP-MOSFET stack functions as a parallel electrical connection of the stacked SVP-MOSFET devices with a correspondingly reduced on-resistance Rds, increased current-carrying capacity and reduced package footprint.

2. The SVP-MOSFET of claim 1 wherein the SVP-MOSFET device thickness is from about 5 micron to about 100 micron.

3. The SVP-MOSFET of claim 1 wherein each of said source-body regions located next to a TSDV is formed with a source-body cut-off profile spaced sufficiently away from the TSDV to sustain a drain-source voltage in between.

4. The SVP-MOSFET of claim 1 wherein each of said TSDV, TSGV and TSSV further comprises a corresponding via insulating layer surrounding thus insulating it from the semiconductor substrate.

5. A packaged multi-unit power MOSFET stack comprising:
    a bottom MOSFET unit comprising:
        a bottom semiconductor substrate with a bottom drain metal layer formed thereon;
        a plurality of gate regions and source-body regions formed atop the bottom semiconductor substrate;
        a patterned gate metal layer and a patterned source-body metal layer respectively connecting the gate regions and the source-body regions; and:
            a conductive through substrate drain via (TSDV), formed through the semiconductor substrate but insulated there from whilst in contact with the bottom MOSFET unit drain metal layer, having a top drain contacting means; and
    a top MOSFET unit comprising:
        a top semiconductor substrate with a bottom drain metal layer formed thereon;
        a plurality of gate regions and source-body regions formed atop the top semiconductor substrate;
        a patterned gate metal layer and a patterned source-body metal layer respectively connecting the gate regions and the source-body regions;
        a bottom drain contacting means for making a bottom surface electrical contact to the bottom drain metal layer of the top MOSFET unit;
        a conductive through substrate gate via (TSGV), formed through the top semiconductor substrate but insulated there from whilst connecting with the gate metal layer, having a top gate contacting means and a bottom gate contacting means for respectively making a top surface and a bottom surface electrical contact to the TSGV; and
        a conductive through substrate source via (TSSV), formed through the top semiconductor substrate but insulated there from whilst connecting with the source-body metal layer, having a top source contacting means and a bottom source contacting means for respectively making a top surface and a bottom surface electrical contact to the TSSV
    such that the stack functions as a parallel electrical connection of the stackable power MOSFET units with a correspondingly reduced on-resistance Rds, increased current-carrying capacity and reduced package footprint; and
    a packaging means for interconnecting the stack to its external operating environment.

6. The packaged stack of claim 5 wherein within a top or bottom MOSFET unit containing a TSSV and/or TSDV, the TSSV and/or TSDV are distributed throughout the MOSFET unit active area.

7. The packaged stack of claim 5 wherein within a top or bottom MOSFET unit containing numerous TSSVs and TSDVs, the TSSVs and TSDVs are interdigitated but electrically isolated from one another.

8. The packaged stack of claim 5 wherein the TSDV, the TSGV and the TSSV are properly mapped within the major device plane of their respective top and bottom MOSFET units such that, upon their stacking:

the top drain contacting means of the bottom MOSFET unit line up with the bottom drain contacting means of the top MOSFET units;

the top gate contacting means of the bottom MOSFET unit would line up with the bottom gate contacting means of the top MOSFET units; and the top source contacting means of the bottom MOSFET unit would line up with the bottom source contacting means of the top MOSFET units.

9. The packaged stack of claim 5 wherein each of said source-body regions located next to a TSDV is formed with a source-body cut-off profile spaced sufficiently away from the TSDV to sustain a drain-source voltage in between.

10. The packaged stack of claim 5 wherein each of said TSDV, TSGV and TSSV comprises a corresponding via insulating layer surrounding thus insulating it from the corresponding semiconductor substrate.

11. The packaged stack of claim 5 wherein the bottom MOSFET unit only has TSDV, the top power MOSFET unit only has TSGV and TSSV.

12. The packaged stack of claim 5 further comprising one or more medium MOSFET units stacked between the top MOSFET unit and the bottom MOSFET unit.

13. The packaged stack of claim 12 wherein each of the one or more medium MOSFET units comprising:

a semiconductor substrate with a bottom drain metal layer formed thereon;

a plurality of gate regions and source-body regions formed atop the semiconductor substrate;

a patterned gate metal layer and a patterned source-body metal layer respectively connecting the gate regions and the source-body regions;

a conductive through substrate drain via (TSDV), formed through the semiconductor substrate but insulated there from whilst in contact with the drain metal layer, having a top drain contacting means and a bottom drain contacting means for respectively making a top surface and a bottom surface electrical contact to the TSDV;

a conductive through substrate gate via (TSGV), formed through the semiconductor substrate but insulated there from whilst in contact with the gate metal layer, having a top gate contacting means and a bottom gate contacting means for respectively making a top surface and a bottom surface electrical contact to the TSGV; and a conductive through substrate source via (TSSV), formed through the semiconductor substrate but insulated there from whilst in contact with the source-body metal layer, having a top source contacting means and a bottom source contacting means for respectively making a top surface and a bottom surface electrical contact to the TSSV.

14. The packaged stack of claim 13 wherein the TSDV, the TSGV and the TSSV are properly mapped within the major device plane of their respective medium MOSFET units such that, upon their stacking:

the top drain contacting means and bottom drain contacting means of a medium MOSFET unit would respectively line up with the bottom drain contacting means and top drain contacting means of its neighboring medium MOSFET units;

the top gate contacting means and bottom gate contacting means of a medium MOSFET unit would respectively line up with the bottom gate contacting means and top gate contacting means of its neighboring medium MOSFET units; and the top source contacting means and bottom source contacting means of a medium MOSFET unit would respectively line up with the bottom source contacting means and top source contacting means of its neighboring medium MOSFET units.

15. A method of making a packaged multi-unit power MOSFET stack having a number of power MOSFET units bonded in parallel connection with one another, the method comprises:

fabricating a number of stackable power MOSFET units each having:

a semiconductor substrate with a bottom drain metal layer formed thereon;

a plurality of gate regions and source-body regions formed atop the semiconductor substrate;

a patterned gate metal layer and a patterned source-body metal layer respectively connecting the gate regions and the source-body regions; and through substrate vias including:

a conductive through substrate drain via (TSDV), in contact with the drain metal layer, having a top drain contacting means and a bottom drain contacting means for respectively making a top surface and a bottom surface electrical contact to the TSDV;

a conductive through substrate gate via (TSGV), in contact with the gate metal layer, having a top gate contacting means and a bottom gate contacting means for respectively making a top surface and a bottom surface electrical contact to the TSGV; and a conductive through substrate source via (TSSV), in contact with the source-body metal layer, having a top source contacting means and a bottom source contacting means for respectively making a top surface and a bottom surface electrical contact to the TSSV;

stacking and bonding the power MOSFET units to form the multi-unit power MOSFET stack with its parallel connection effected by said TSDV, TSGV and TSSV; and interconnecting the stack to its external operating environment.

16. The method of claim 15 wherein within a power MOSFET unit having TSDVs and/or TSSVs, the method further comprises distributing the TSDVs and/or TSSVs throughout the MOSFET unit active area.

17. The method of claim 15 wherein fabricating the TSDV plus its bottom drain contacting means for a bottom stackable power MOSFET unit further comprises:

opening up the source-body metal layer at a desired TSDV location;

fabricating, at the desired TSDV location, a partially through substrate drain via PTSDV together with its top drain contacting means such that the PTSDV:

is insulated from the semiconductor substrate; and partially penetrates into the substrate wafer;

thinning bottom of the substrate wafer till the desired thickness with simultaneous exposure of the PTSDV bottom thus creation of the TSDV; and forming a bottom drain metal layer onto the substrate wafer.

18. The method of claim 15 wherein each power MOSFET unit has a thin thickness so as to reduce the corresponding thickness and on-resistance Rds of the multi-unit power MOSFET stack and, correspondingly, fabricating each power MOSFET unit further comprises:

fabricating top portion of the power MOSFET unit, excluding the TSDV plus its bottom drain contacting means, TSGV plus its bottom gate contacting means and TSSV plus its bottom source contacting means, on a substrate wafer of an original thickness;

thinning bottom of the substrate wafer till the desired ultra thin thickness and fabricating at least one of the TSDV plus its bottom drain contacting means, TSGV plus its bottom gate contacting means and TSSV plus its bottom source contacting means.

19. The method of claim 18 wherein:

fabricating the TSDV plus its bottom drain contacting means, the TSGV plus its bottom gate contacting means, and the TSSV plus its bottom source contacting means further comprises carrying them out in parallel.

20. The method of claim 19 further comprises:

forming a bottom drain metal layer and opening it up at various desired TSDV, TSGV and TSSV locations; and simultaneously fabricating:

at the desired TSDV location, the TSDV together with its bottom drain contacting means such that the TSDV is insulated from the semiconductor substrate whilst in electrical contact with both the top drain contacting means and the bottom drain contacting means and the bottom drain metal layer;

at the desired TSGV location, the TSGV together with its bottom gate contacting means such that the TSGV is insulated from both the semiconductor substrate and the drain metal layer whilst in electrical contact with both the top gate contacting means and the bottom gate contacting means and the gate metal layer; and at the desired TSSV location, the TSSV together with its bottom source contacting means such that the TSSV is insulated from both the semiconductor substrate and the drain metal layer whilst in electrical contact with both the top source contacting means and the bottom source contacting means and the source-body metal layer.

21. The method of claim 15 wherein fabricating the through substrate vias further comprises:

forming a top metal layer over the semiconductor substrate;

segmenting the top metal layer into the source-body metal layer, the gate metal layer and, at desired TSDV locations, a top drain metal layer;

forming a bottom drain metal layer and opening it up at the desired through substrate via locations; and fabricating, at the desired through substrate via locations, the through substrate via with a bottom contacting means such that the through substrate via is insulated from the semiconductor substrate whilst in contact with the appropriate section of the top metal layer and the bottom contacting means, wherein the TSSV and TSGV are insulated from the bottom drain metal.

22. The method of claim 21 wherein fabricating the through substrate vias further comprises:

depositing and patterning a drain metal passivation beneath the bottom drain metal layer while surrounding the desired through substrate via locations;

with the opened bottom drain metal layer and patterned drain metal passivation as masks, directionally etching through the semiconductor substrate to create a through substrate tunnel reaching but limited by the segmented top metal layer; and fabricating the through substrate vias inside the through substrate tunnel and the bottom contacting means beneath the bottom drain metal layer and the drain metal passivation.

23. The method of claim 22 wherein fabricating the through substrate vias further comprises:

forming a via insulating layer upon the exposed surfaces of the through substrate tunnel;

directionally etching away all horizontally oriented layer portions of the via insulating layer to uncover the segmented top metal layer at the end of the through substrate tunnel;

overfilling the through substrate tunnel and the patterned drain metal passivation with a conductive via material; and patterning the bottom of the conductive via material to form the bottom contacting means.

24. The method of claim 23 wherein overfilling with a conductive via material comprises:

sputtering a seed layer on the back side of the semiconductor substrate;

plating a thick metal upon the seed layer till the thick metal overfills the through substrate tunnel and the patterned drain metal passivation thus forming a bottom surface metallization layer.

\* \* \* \* \*